(12) United States Patent
Hoff et al.

(10) Patent No.: US 12,087,383 B2
(45) Date of Patent: Sep. 10, 2024

(54) VIRTUALIZED SCAN CHAIN TESTING IN A RANDOM ACCESS MEMORY (RAM) ARRAY

(71) Applicant: Ampere Computing LLC, Santa Clara, CA (US)

(72) Inventors: David Hoff, Cary, NC (US); Yeshwant Kolla, Wake Forest, NC (US); Rahul Nadkarni, Cary, NC (US); Babji Vallabhaneni, San Jose, CA (US)

(73) Assignee: Ampere Computing LLC, Santa Clara, CA (US)

( * ) Notice: Subject to any disclaimer, the term of this patent is extended or adjusted under 35 U.S.C. 154(b) by 0 days.

(21) Appl. No.: 17/856,262

(22) Filed: Jul. 1, 2022

(65) Prior Publication Data

US 2024/0006012 A1    Jan. 4, 2024

(51) Int. Cl.
  *G11C 29/44*   (2006.01)
  *G11C 29/12*   (2006.01)
  *G11C 29/20*   (2006.01)
  *G11C 29/32*   (2006.01)

(52) U.S. Cl.
  CPC ...... *G11C 29/4401* (2013.01); *G11C 29/1201* (2013.01); *G11C 29/20* (2013.01); *G11C 29/32* (2013.01); *G11C 2029/1204* (2013.01)

(58) Field of Classification Search
  CPC . G11C 29/4401; G11C 29/1201; G11C 29/20; G11C 29/32; G11C 2029/1204
  See application file for complete search history.

(56) References Cited

U.S. PATENT DOCUMENTS

| | | | | |
|---|---|---|---|---|
| 2006/0256637 | A1* | 11/2006 | Takahashi | G11C 29/44 365/222 |
| 2008/0168331 | A1* | 7/2008 | Vogelsang | G11C 7/1006 714/770 |
| 2015/0309750 | A1* | 10/2015 | Chen | G06F 3/0644 711/104 |
| 2017/0110182 | A1* | 4/2017 | Liaw | G11C 11/412 |

\* cited by examiner

*Primary Examiner* — Mohammed A Bashar
(74) *Attorney, Agent, or Firm* — Withrow & Terranova, PLLC

(57) ABSTRACT

Virtualized scan chain testing in a random access memory array, and related methods and computer-readable media are disclosed. To facilitate virtualized scan chain testing, the memory array includes an integrated test circuit that causes the memory array to behave as a serialized scan chain. The integrated test circuit forces serialized write and read access to offset entries in the memory array on each scan cycle in a scan mode based on received serialized test data. After the number of scan cycles equals the number of entries the memory array, the entries in the memory array are fully initialized with test data from the serial test data flow. In subsequent scan cycles, the integrated test circuit continues to perform serial read operations to cause stored serial test data to be serially shifted out as an output serial data flow that then be compared to the original serial test data.

22 Claims, 18 Drawing Sheets

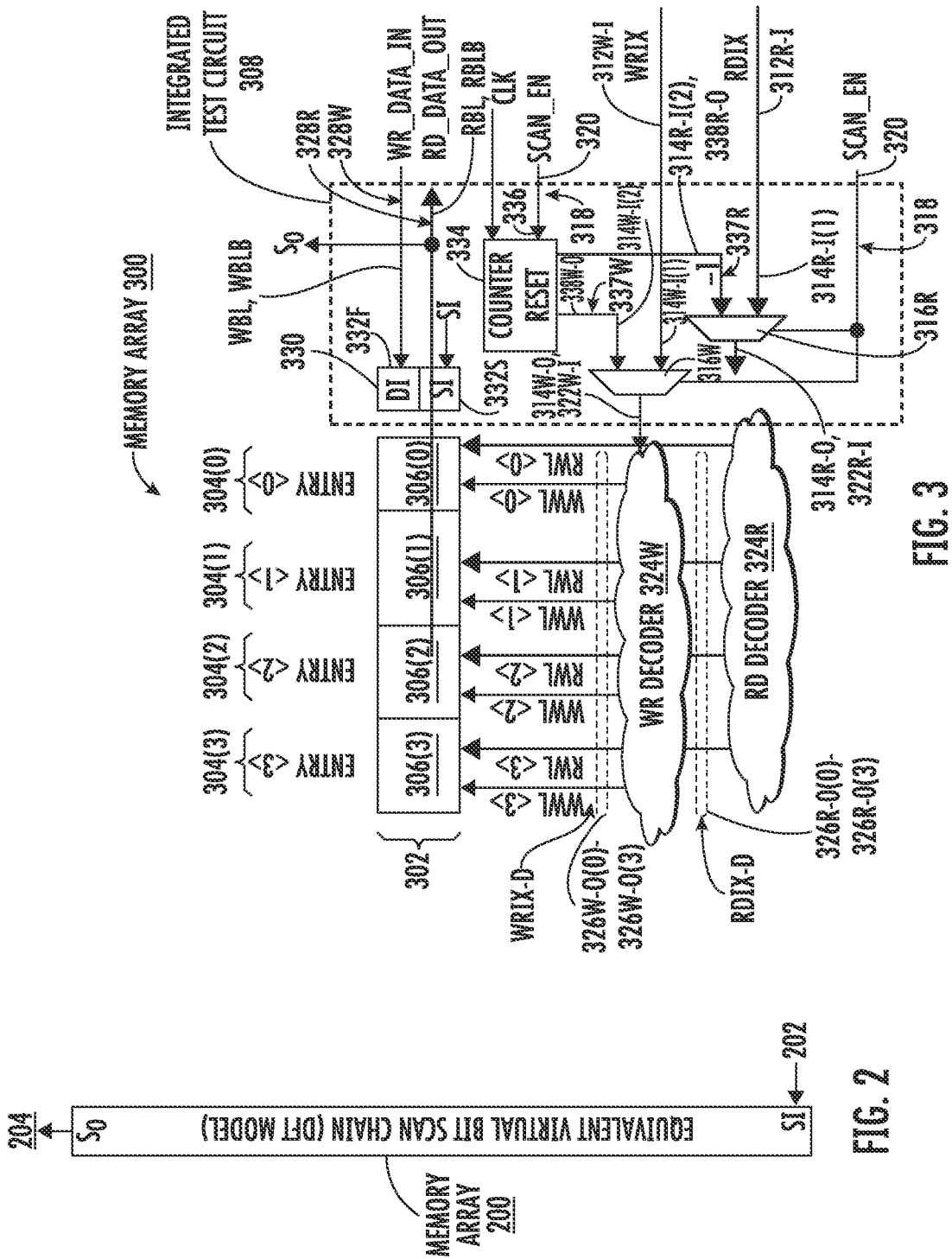

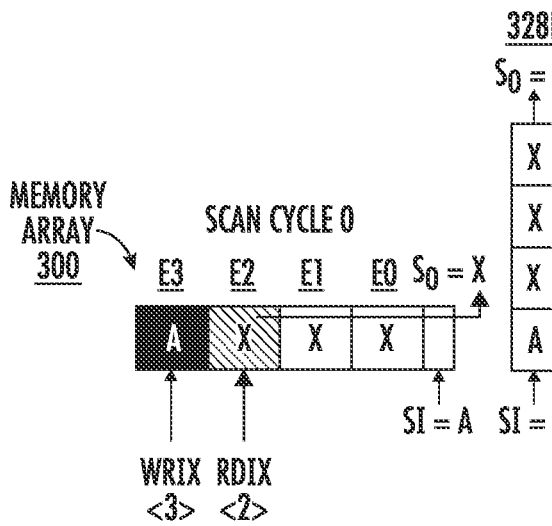
FIG. 4A
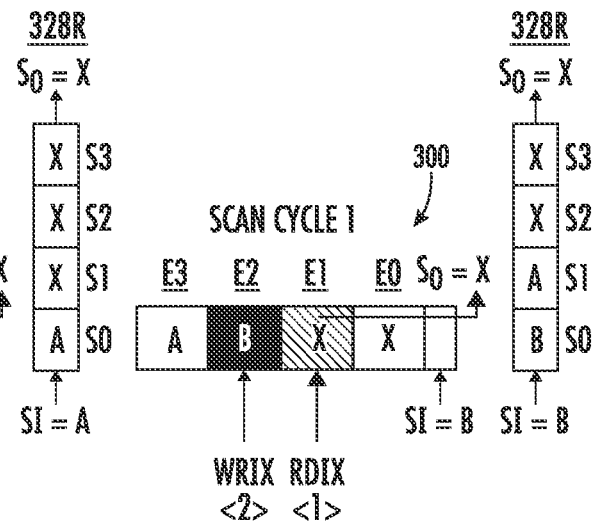
FIG. 4B
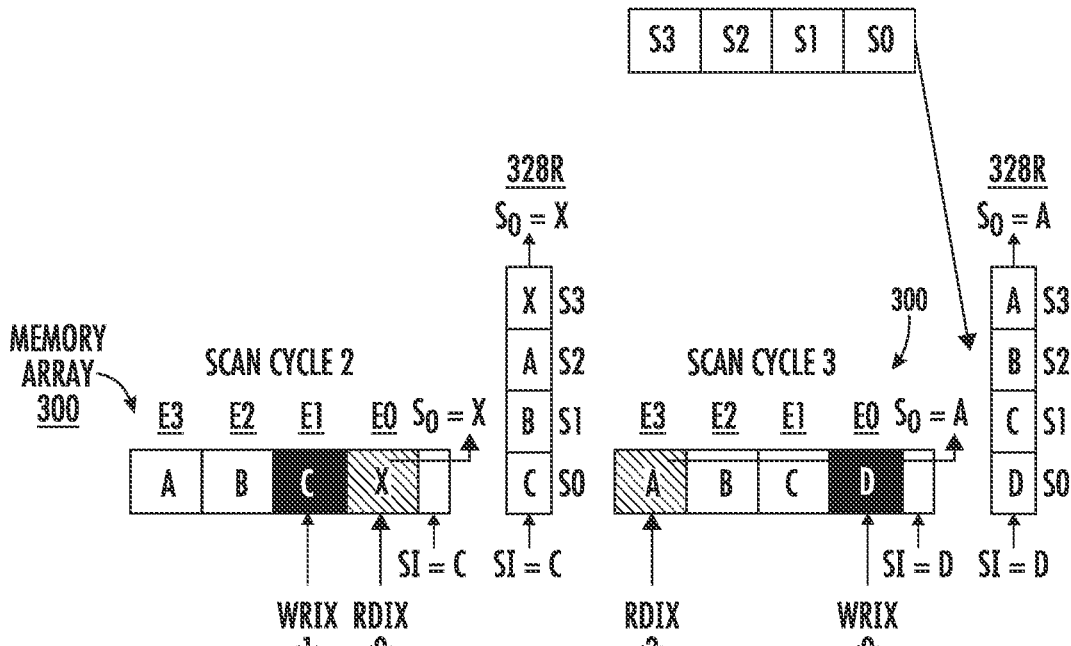
FIG. 4C
FIG. 4D

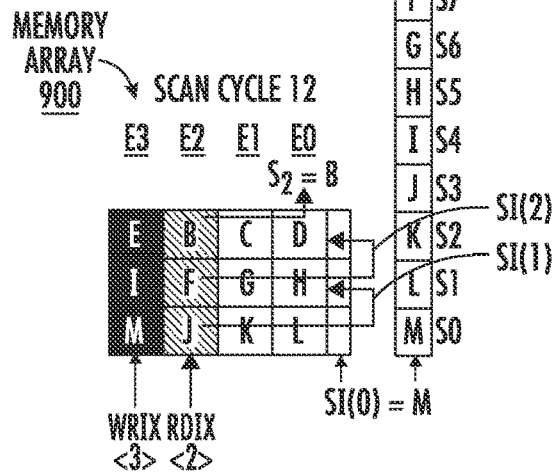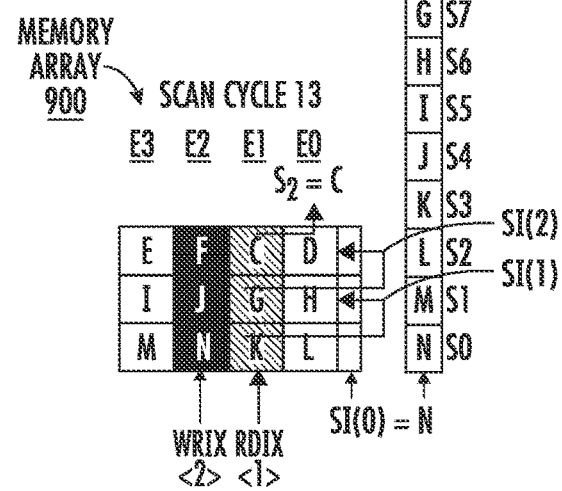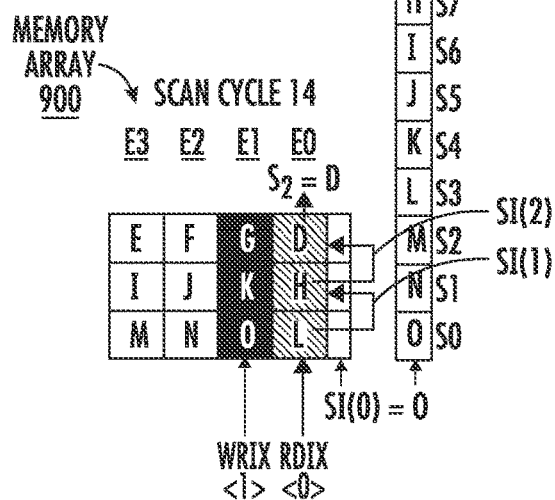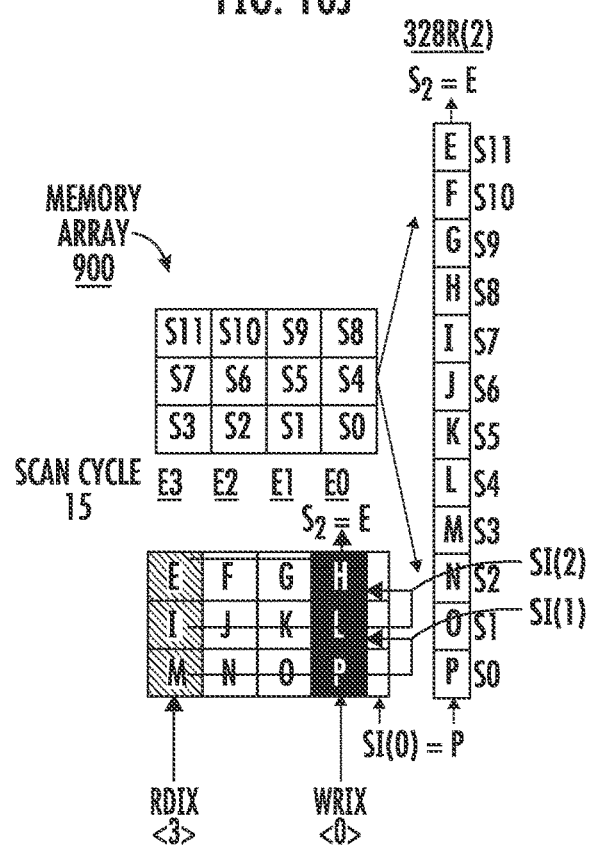
FIG. 10I
FIG. 10J
FIG. 10K
FIG. 10L

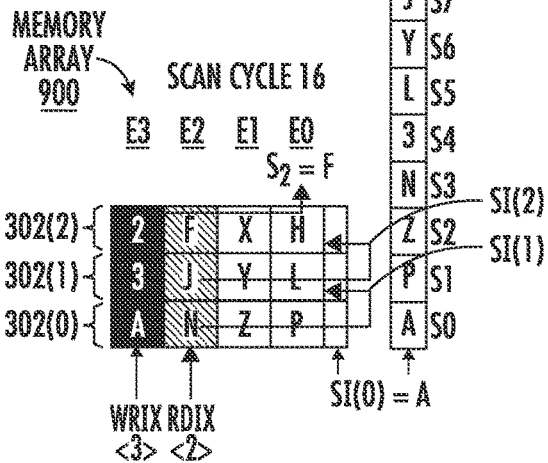
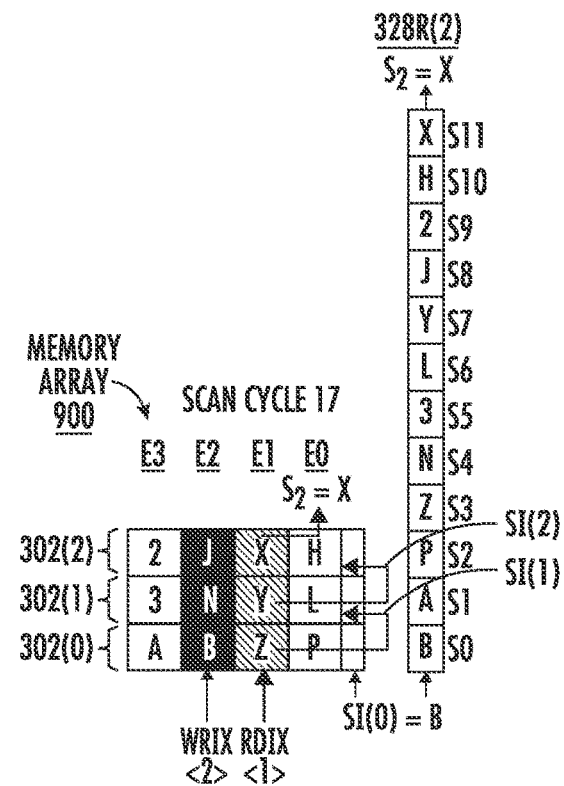
FIG. 13A
FIG. 13B
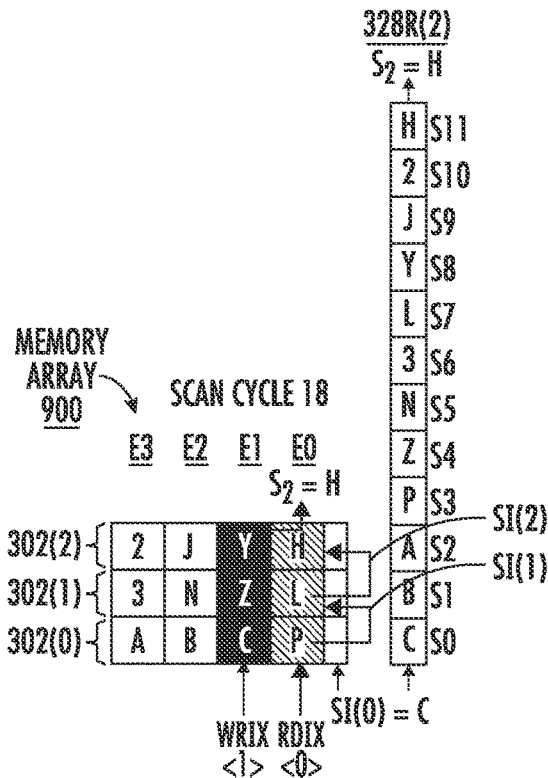
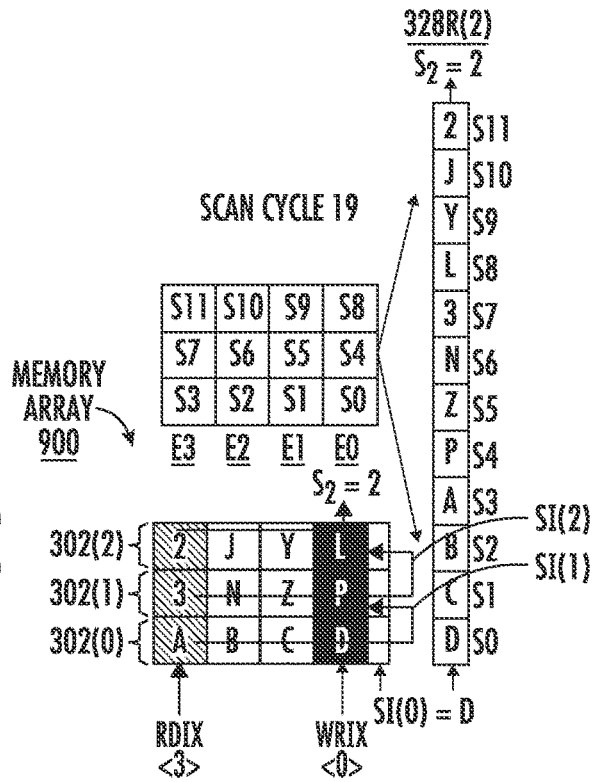
FIG. 13C
FIG. 13D

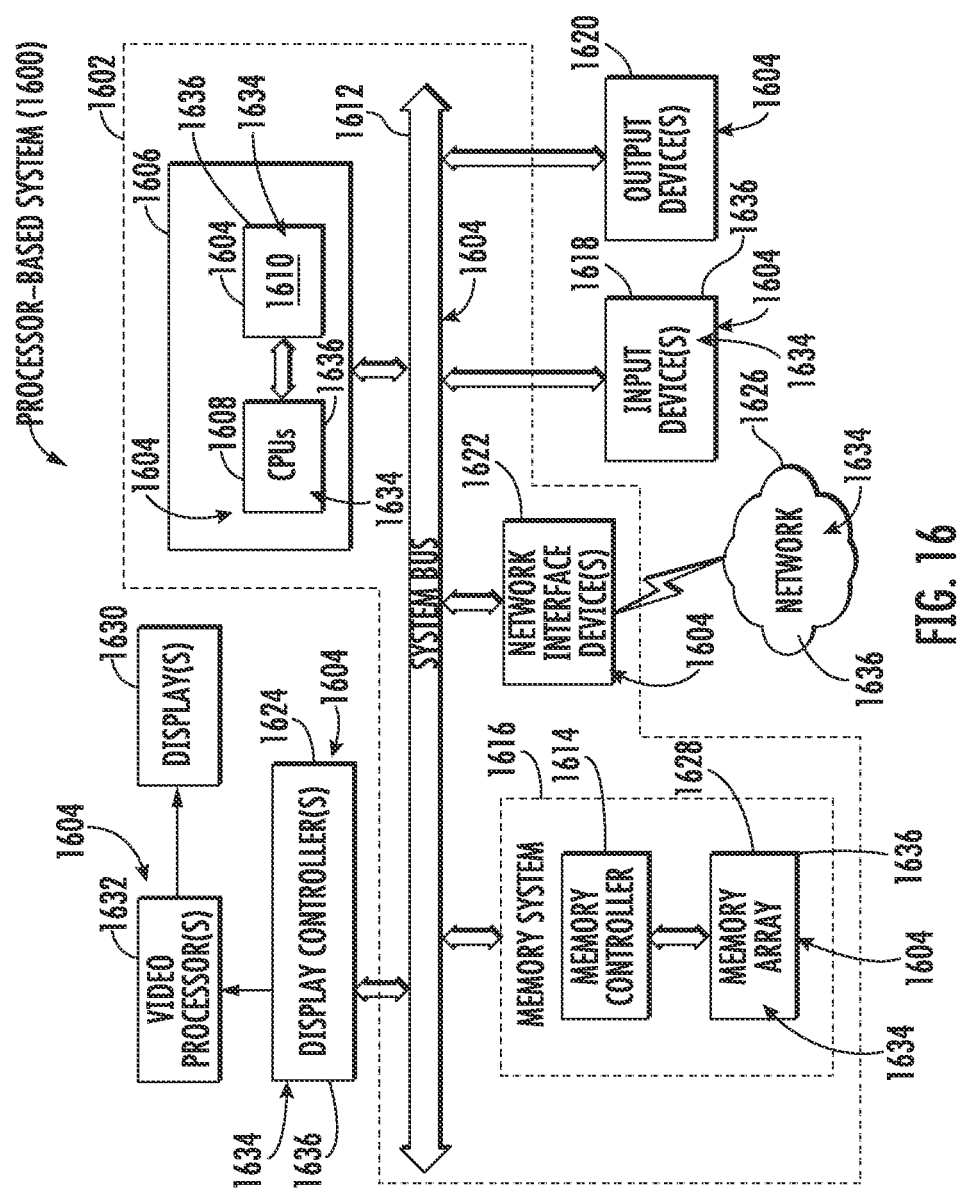

VIRTUALIZED SCAN CHAIN TESTING IN A RANDOM ACCESS MEMORY (RAM) ARRAY

FIELD OF THE DISCLOSURE

The technology of the disclosure relates to computing memory systems, and more particularly to testing of memory arrays in the memory system using self-test circuits incorporated in or "built-in" such memory systems.

BACKGROUND

Computing systems, also known as processor-based systems, include one or more central processing units (CPUs) to execute program instructions to perform tasks. Such computing systems also include a memory system that contains one or more memory arrays that can be used to store program instructions and data. A CPU can read instructions from memory to be executed, and can also read data from memory to be processed as part of executing an instruction. A CPU can also store data resulting from executed instructions back into memory. Memory systems commonly include a hierarchy of lower level to higher level cache memories, as well as a system memory that contains memory storage for the entire physically addressable space of the computing system. It is important that the memory system and memory cells in a memory array function property for accurate storage of data. Although memory systems commonly employ parity and other error code correction (ECC) schemes to allow for detection and possibly correction of bit errors, it is desired that memory systems be tested for functionality and reliability.

In this regard, test circuits are conventionally employed in a memory system in a computing system to test memory functionality and reliability. For example, a built-in self-test (BIST) circuit may be incorporated into a computing system to perform memory tests by writing and reading various data patterns to and from an associated memory array to detect memory faults. By comparing known data written and the same data subsequently read from the memory array, the BIST circuit is able to determine whether memory cells of the memory array have faults. A BIST circuit can generate a variety of predetermined test patterns and asserts or de-asserts an output signal based on the results of the memory test. Different algorithms may be used for detecting memory faults. Automatic test pattern (ATP) data flows, such as all zeros, all ones, or a "checkerboard" pattern having alternating zeros and ones may be generated and written and verified (i.e., scanned) throughout the memory cells in a tested memory array as examples. Moreover, data from an automatic test pattern generation (ATPG) data flow may be written to the memory cells in a tested memory array in any order, such as consecutively in an increasing or decreasing addressing scheme.

It may also be desired to test register files. For example, a computing system may have static register files (SRFs) provided in an SRF array(s) used for storing register values used in execution of instructions or for other lower-lever processing functions. SRFs can be provided as scannable flip-flop circuits (also referred to as a "flop tray") for convenient testability using a serialized ATPG data flow without the requirement to provide a separate BIST circuit to test the SRF. This is because the flop tray can be programmably configured to have a serial connectivity in a scan (i.e., test) mode. A serialized ATPG data flow also has an advantage of being able to be used as test chains for different types of memory, because the ATPG data flow is serialized independent of the memory organization structure. Data from a serialized ATPG data flow can be latched serially into a first flip-flop in a serial flip-flop circuit chain in a first scan cycle. The data stored in each flip-flop in the flop tray is output to a next, downstream, serially connected flip-flop in a next scan cycle. Thus, a serial ATPG data flow that is input serially into the first flip-flop in the flop tray will result in a serialized output generated by the last flip flop in the flop tray. The serialized output will match the serialized ATPG data flow if the SRF is functioning properly.

It may be desired to find alternative memory cells to flip-flop circuits to use in an SRF or other memory to conserve die area and power. In this regard, SRFs can alternatively be provided as static random access memory (SRAM) cells (e.g., six (6) transistor (T) (6T) cells) to conserve area and power. However, for example, 6T-based SRAM cells may be non-scannable in that they cannot be scanned by being arranged in a serialized fashion through internal reconfiguration with the input data from a first memory cell to be output to be latched in a next, serialized connected memory cell like a flop tray. By their functional design, 6T-based SRAM cells are organized in memory columns, wherein data from only one activated SRAM cell in a column is read (i.e., sensed) for that column onto a shared bit line(s) for that column. The shared bit line(s) in each memory column is not coupled to next SRAM cells in a given memory row to make a serial connection of SRAM cells possible. Thus, an external BIST circuit is conventionally provided and interfaced to a memory array to scan a 6T-based SRAM array in a scan mode. However, an external BIST circuit consumes additional die area in the computing system. An external BIST circuit may have an external logic interface to selectively interface (e.g., multiplexed) to a number of different SRF arrays to be tested. The selective interfacing of the BIST circuit to different SRF arrays adds to testing latency.

SUMMARY

Aspects disclosed herein include virtualized scan chain testing in a random access memory (RAM) array. Related methods and computer-readable media are also disclosed. The memory array can be included in a memory in a computing system. As a non-limiting example, the memory array may be a static RAM (SRAM) array in a memory system. The memory array may be a cache memory or system memory in a computing system, as non-limiting examples. As another example, the memory array may be a register file, such as a static register file (SRF). The memory array can include at least one memory column of memory bit cells, wherein each memory bit cell in a given memory column is an entry in a corresponding memory row in the memory array. It may be desired to include functionality in the memory array so that the memory array can be modeled as a virtualized scan chain that can be tested with serialized test data/bits (e.g., automatic test program generation (ATPG) data). In this regard, in exemplary aspects, as disclosed in more detail below, to facilitate virtualized scan chain testing in the memory array, the memory array includes an integrated test circuit that is internal to the memory array. In a scan (i.e., test) mode, the integrated test circuit causes the entries in the memory array to be accessed as a serialized scan chain. The integrated test circuit forces addressing of entries in the memory array as a serial chain to write the received serialized test data in a serialized format in the memory array and then shifted within the memory array, the test data eventually being output externally. In this manner, the serialized test data that was written serially into the memory array can be read out also as an output serialized data stream to be compared against the serialized test data in a scan mode to determine if the memory array has functional faults.

In this regard, in one example, to link the write and read operations in the memory array in a scan mode to virtualize a serialized scan chain, the integrated test circuit includes a counter circuit. The counter circuit is configured to generate a write count value that is used to index the entries in the memory array in each scan cycle in the scan mode. In each scan cycle of the scan mode, the integrated test circuit indexes an entry in the memory array at the write value to write the next serial data received from a serialized test data stream into such indexed entry. In this manner, the integrated test circuit controls the writing of the incoming serialized test data into the entries as a serialized scan chain. The data that was previously stored at the indexed entry to be written was read in a previous scan cycle. Also, in each scan cycle in the scan mode, the counter circuit is configured to generate a read value that is incremented or decremented forward from the write value by an offset value. The integrated test circuit uses the read count to index a next entry at an offset value (e.g., an immediately adjacent entry) to the current written entry to read the data stored in this next entry. In this manner, in the scan mode, the integrated test circuit in essence reads and shifts stored data in an entry to be overwritten with next incoming serialized test data. The read data is written to a next entry at an offset value from a current entry to be written with test data. The serial data written to the memory array in a serialized scan chain is eventually shifted out of the memory array as serialized output data after a number of scan cycles is equal to the number of entries (or number of bit cells over the number of entries if the entries contain more than one bit cell) the memory array. After a number of scan cycles equal to the number of entries (or number of bit cells over the number of entries if the entries contain more than one bit cell), the memory array entries in the memory array are fully initialized with test data from the received serialized test data stream. The output serial data stream can be then compared to the original serialized test data to determine if the corresponding bits match. Matching bits between the received serialized test data stream and the output serial data stream means the entries in the memory array are functioning properly.

In this manner, a separate, external built-in test (BIST) circuit is not required to force the indexing of entries in the memory array as a virtualized serialized scan chain to test the memory array with a serialized test data stream. The integrated test circuit in the memory array internally controls the write and read access to adjacent entries by an offset value in each scan cycle of a scan mode that are then incremented/decremented in each subsequent scan cycle to create a virtualized scan chain for the entries in the memory array. This allows a serialized test data stream to be employed to test the memory array even with the memory bit cells of the memory array not being organized in serialized scan chain. From an external interface viewpoint, the memory array appears to have the serially connected data entries, but with such memory organization being virtually accomplished by the circuits and functionality of the integrated test circuit.

Note that the integrated test circuit can also be placed in a non-scan, functional mode (also referred to as a launch/capture mode) in which the entries in the memory array can be accessed randomly by an index(es) for write and read operations. In the functional mode, the integrated test circuit does not force a scan chain linkage of addressed write and read operations to adjacent entries in the memory array in a serialized fashion. The functional mode can be used for normal operating read and write operations outside of testing operations. The functional mode can also be used to test the memory array based on parallelized data words in the form of test patterns that would be asserted in write and read operations as parallelized data/bits. The integrated test circuit can also be configured to operate in a scan dump mode, where data that was previously written to the memory array in a scan or functional mode can be read out as data bits (e.g., serially or randomly) for verification. The integrated circuit can control the memory array to return to a scan mode after a scan dump mode.

In this regard, in one exemplary aspect, a memory array is provided. The memory array includes a first memory column circuit comprising a plurality of memory bit cells each contained in a respective memory row circuit of a plurality of memory row circuits. The memory array is configured to, in response to a first scan cycle of a scan mode, receive a next write input data from a serialized test data stream. The memory array is also configured to, in response to the first scan cycle of the scan mode, generate a next write value. The memory array is also configured to, in response to the first scan cycle of the scan mode, generate a next read value offset from the next write value by an offset value. The memory array is also configured to, in response to the first scan cycle of the scan mode, index a first memory row circuit of the plurality of memory row circuits at the next write value. The memory array is also configured to, in response to the first scan cycle of the scan mode, index a second memory row circuit of the plurality of memory row circuits at the next read value. The memory column circuit is configured to write the next write input data to a first memory bit cell of the plurality of memory bit cells in the indexed first memory row circuit. The memory column circuit is also configured to read a next read output data stored in the second memory bit cell of the plurality of memory bit cells in the indexed second memory row circuit, on a read output.

In another exemplary aspect, a method of scanning a memory array is provided. The method comprises, in a first scan cycle of a scan mode, receiving a next write input data from a serialized test data stream, generating a next write value, and generating a next read value offset from the next write value by an offset value. The method also comprises, in the first scan cycle of the scan mode, indexing at the next write value, a first memory row circuit of a plurality of memory row circuits in a first memory column circuit, the first memory column circuit comprising a plurality of memory bit cells each contained in a respective memory row circuit of the plurality of memory row circuits. The method also comprises, in the first scan cycle of the scan mode, indexing a second memory row circuit of the plurality of memory row circuits at the next read value. The method also comprises writing the next write input data to a first memory bit cell of the plurality of memory bit cells in the indexed first memory row circuit, and reading a next read output data stored in the second memory bit cell of the plurality of memory bit cells in the indexed second memory row circuit, on a read output.

In another exemplary aspect, a non-transitory computer-readable medium is provided. The non-transitory computer-readable medium has stored thereon computer executable instructions which, when executed by a processor in a computing system, cause the processor to, in a first scan cycle of a scan mode: receive a next write input data from a serialized test data stream, generate a next write value, generate a next read value offset from the next write value by an offset value, index at the next write value, a first memory row circuit of a plurality of memory row circuits in a first memory column circuit, the first memory column circuit comprising a plurality of memory bit cells each contained in a respective memory row circuit of the plurality of memory row circuits, and index a second memory row circuit of the plurality of memory row circuits at the next read value. The non-transitory computer-readable medium also has stored thereon computer executable instructions which, when executed by the processor in the computing system, also causes the processor to write the next write input data to a first memory bit cell of the plurality of memory bit cells in the indexed first memory row circuit and read a next read output data stored in the second memory bit cell of the plurality of memory bit cells in the indexed second memory row circuit, on a read data output.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 2 is a diagram of a memory array modeled as a virtualized scan chain that can be tested with serialized test data (e.g., automatic test program generation (ATPG) data);

Figure 5A:
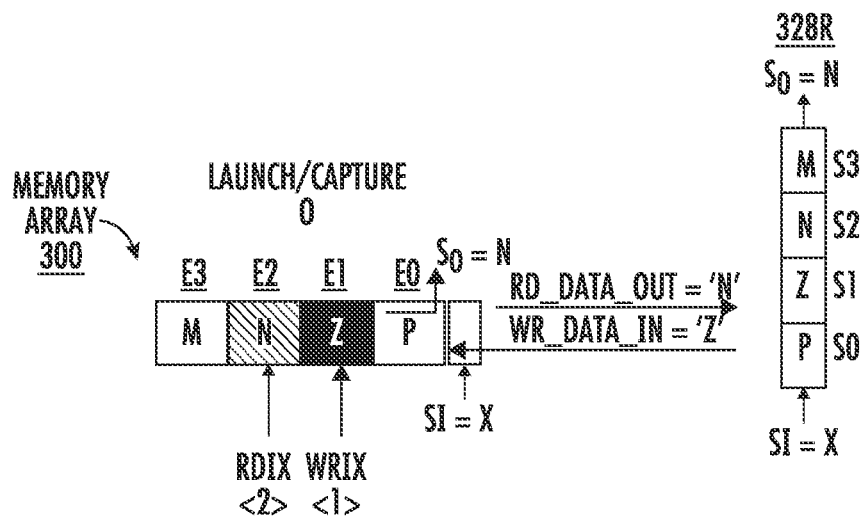
Figure 5B:
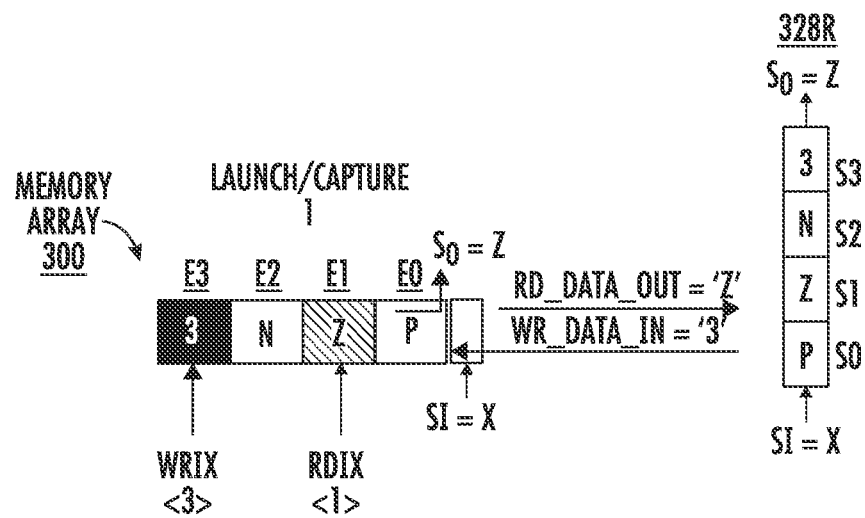
Figure 6:
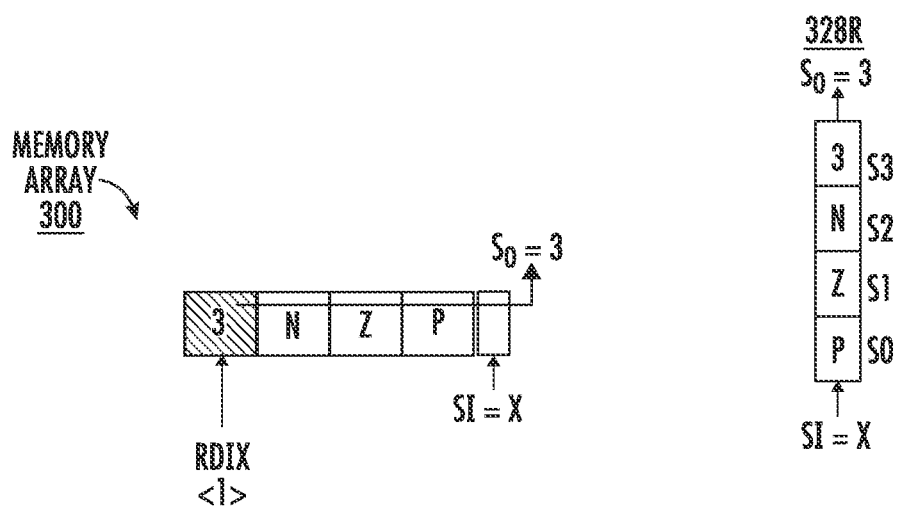
Figure 8:
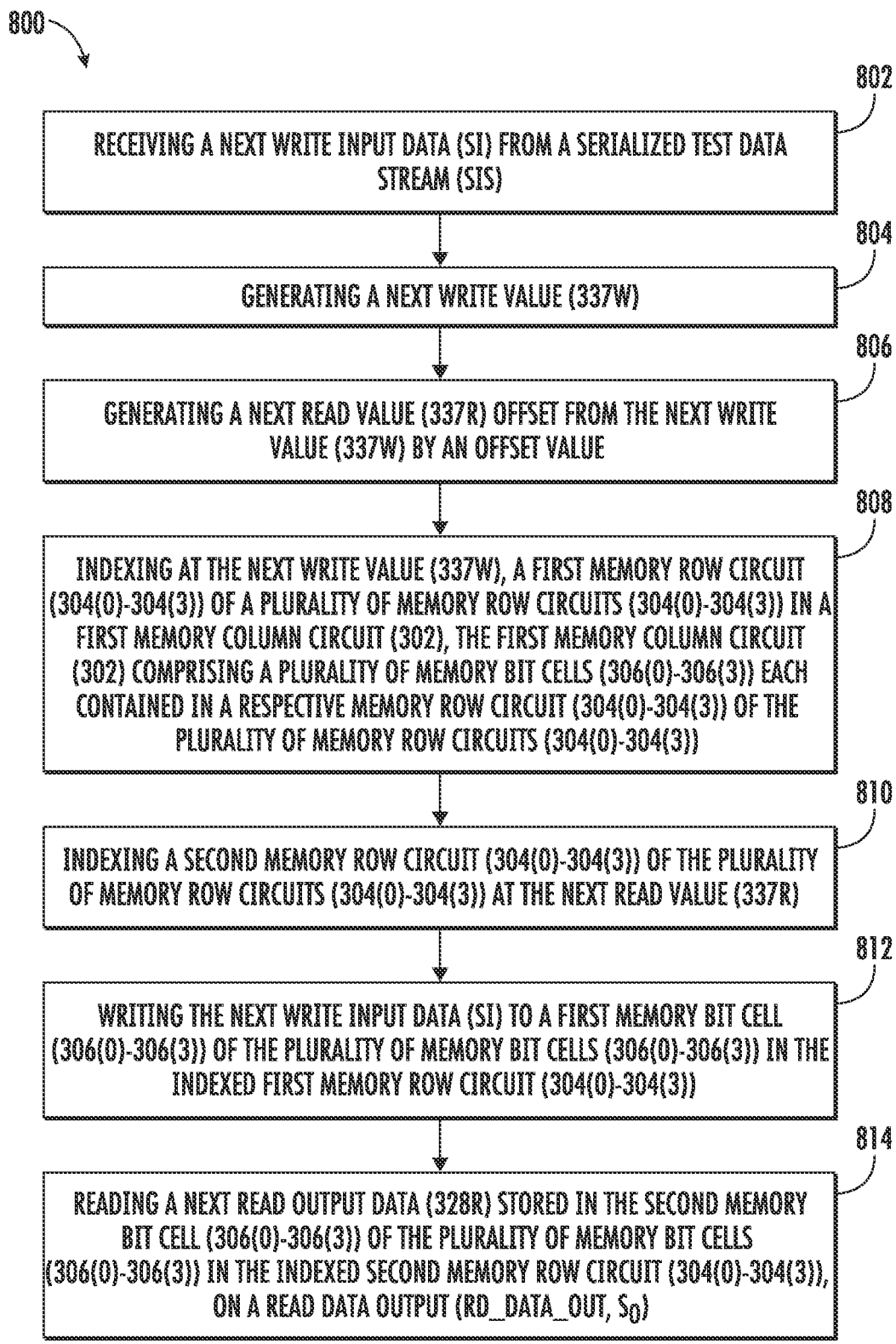
Figure 9:
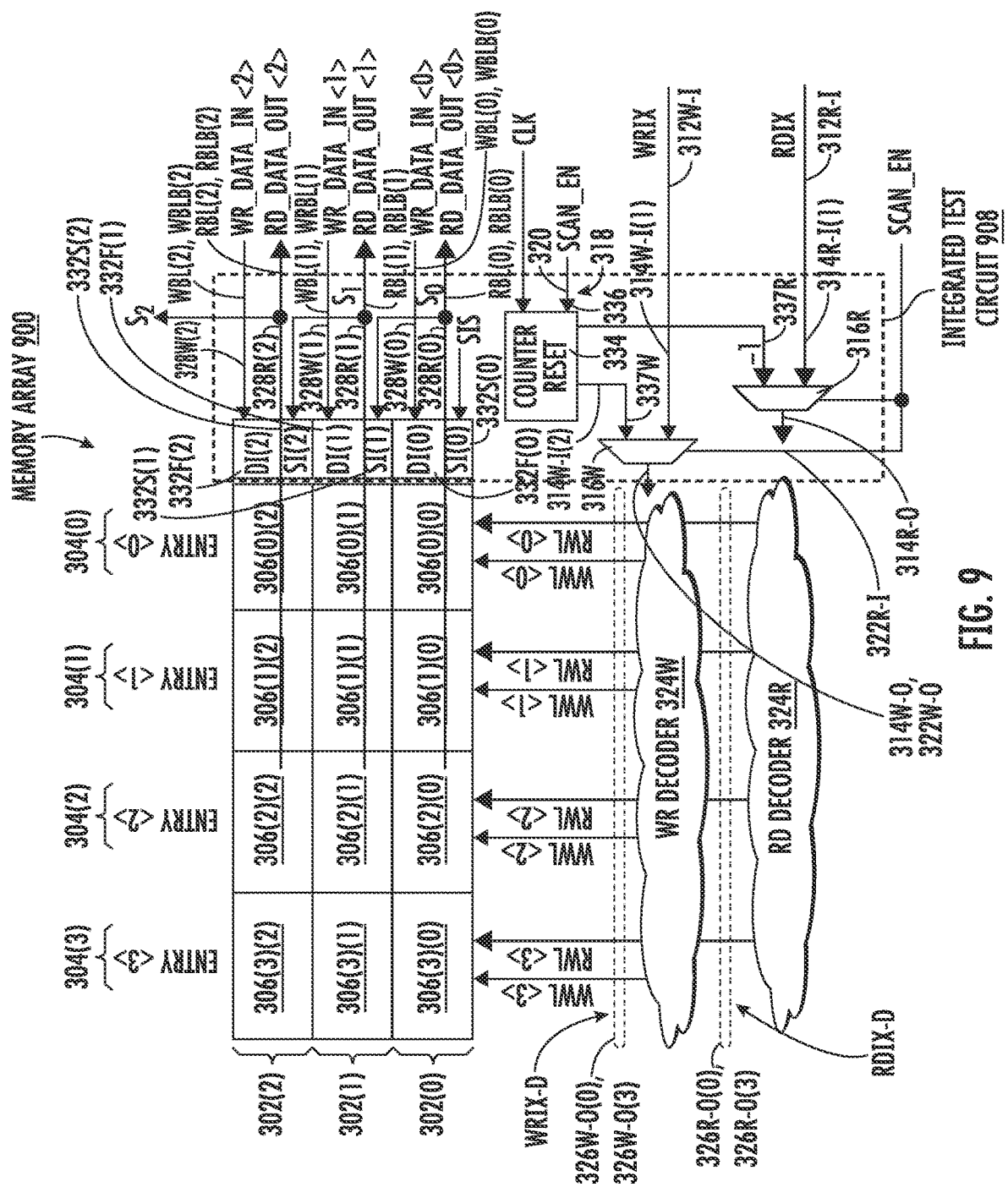

FIG. 3 is a block diagram of an exemplary memory array that can be controlled to provide a virtualized scan chain, wherein the memory array includes a memory row circuit that includes a plurality of memory bit cell circuits as entries that can be randomly accessed through separate write and read ports, and wherein the memory array also includes an integrated test circuit configured to cause entries in the memory array to function as a virtualized scan chain in a scan mode, and also allowing the entries in the memory array to be randomly accessed in a non-scan, functional mode;

FIGS. 4A-4D are block diagrams illustrating data states of entries in the memory array in FIG. 3 based on received serialized test data over respective consecutive scan cycles in an initialization phase of a scan mode;

FIGS. 5A and 5B are block diagrams illustrating data states of entries in the memory array in FIG. 3 over respective consecutive scan cycles in a launch/capture phase, based on the received parallelized test data in FIGS. 4A-4F;

FIG. 6 is a block diagram illustrating a data state of entries in the memory array in FIG. 3 in a scan dump mode in a scan mode;

FIGS. 7A-7D are block diagrams illustrating initialization of entries by the integrated test circuit in the memory array in FIG. 3 with received serialized test data over respective consecutive scan cycles in a scan mode after an initialization phase of a scan mode;

FIG. 8 is a flowchart illustrating an exemplary scan mode process of the integrated test circuit a memory array, such as memory array in FIG. 3, performing write and read operations to cause the memory array to function as a virtualized scan chain in a scan mode;

FIG. 9 is a block diagram of another exemplary memory array that can be controlled to provide a virtualized scan chain, wherein the memory array includes a plurality of memory rows circuits that include a plurality of memory bit cells as entries that can be randomly accessed through separate write and read ports, and wherein the memory array also includes an integrated test circuit configured to cause the entries in the multiple memory row circuits in the memory array to function as a virtualized scan chain in a scan mode, and also allowing the entries in the multiple memory row circuits in the memory array to be randomly accessed in a non-scan, functional mode;

FIGS. 10A-10L are block diagrams illustrating data states of entries in the memory array in FIG. 9 based on received serialized test data over respective consecutive scan cycles in an initialization phase of a scan mode.

Figure 10A:
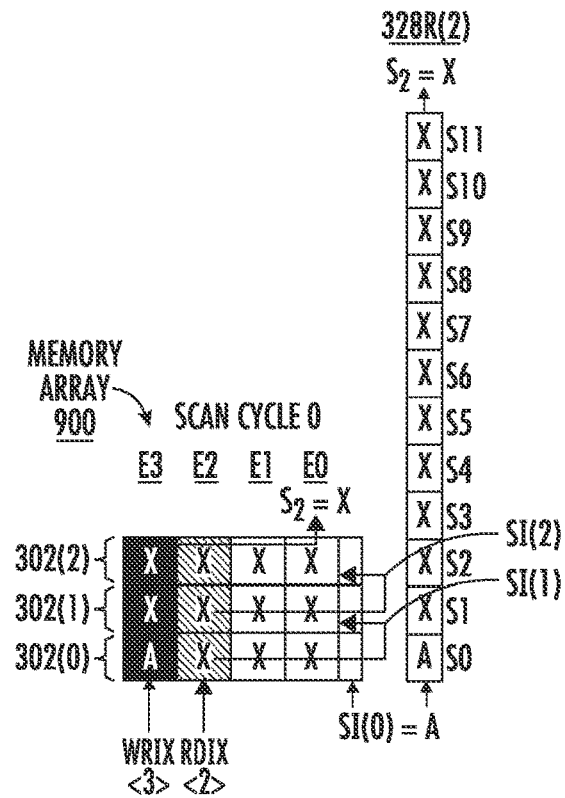
Figure 10B:
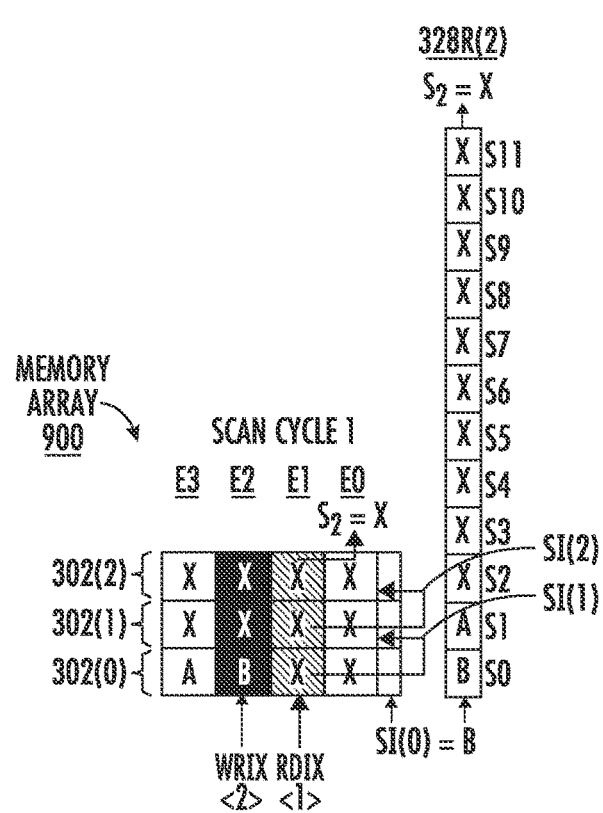
Figure 10C:
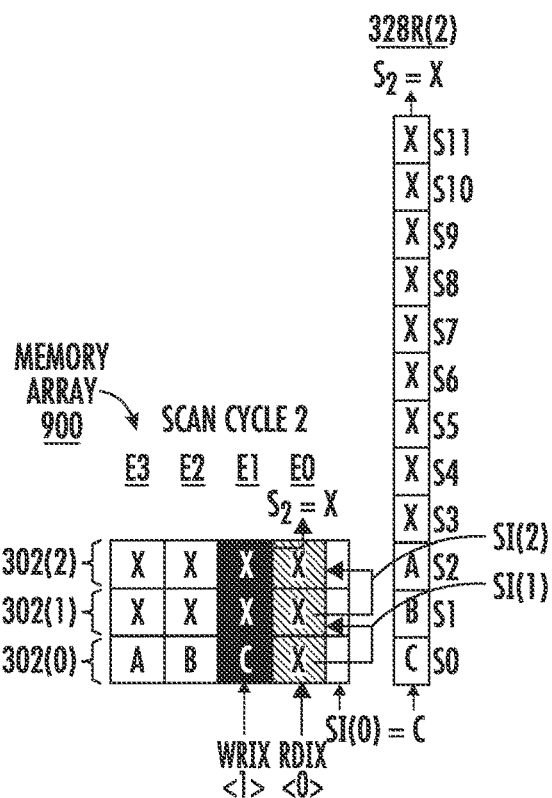
Figure 10D:
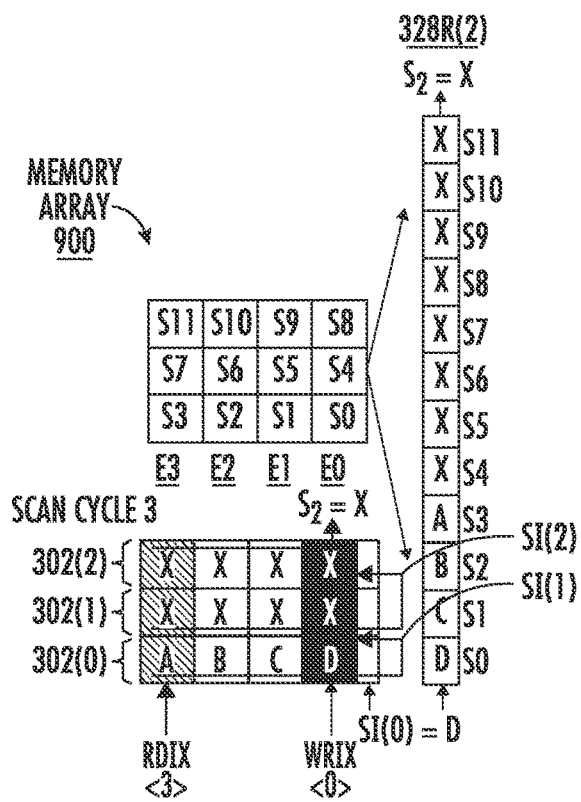
Figure 10E:
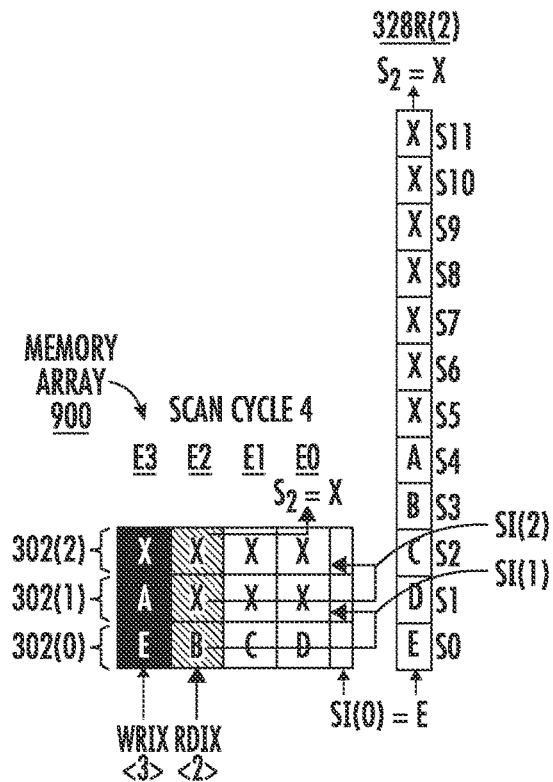
Figure 10F:
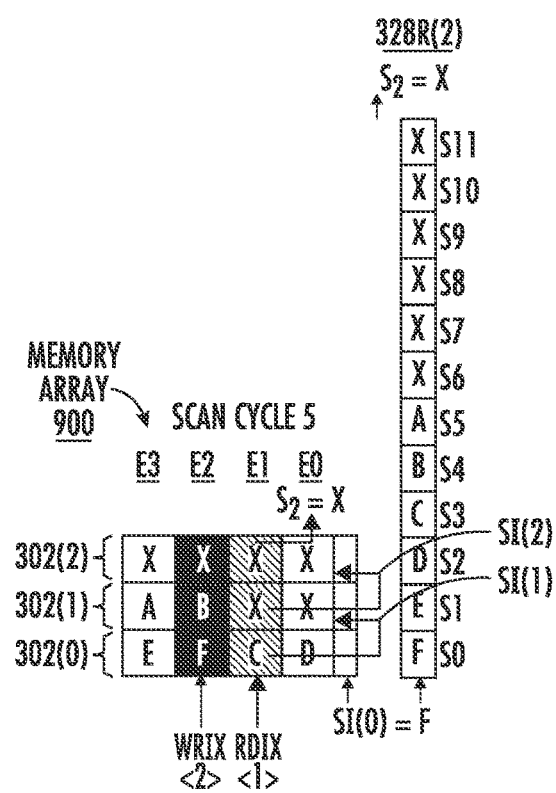
Figure 10G:
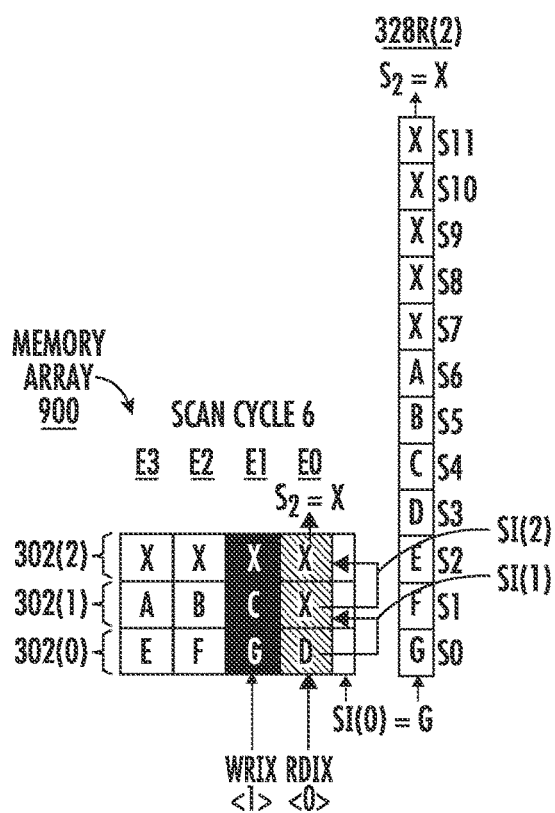
Figure 10H:
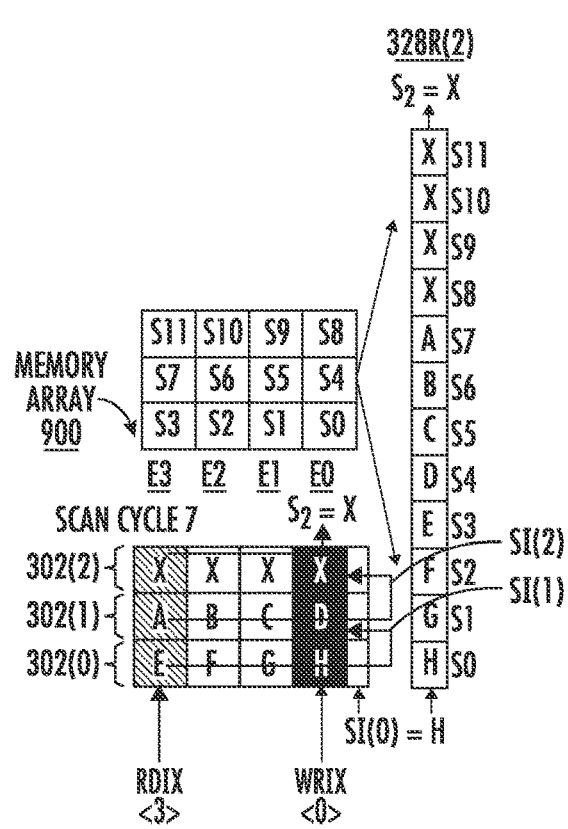
Figure 11A:
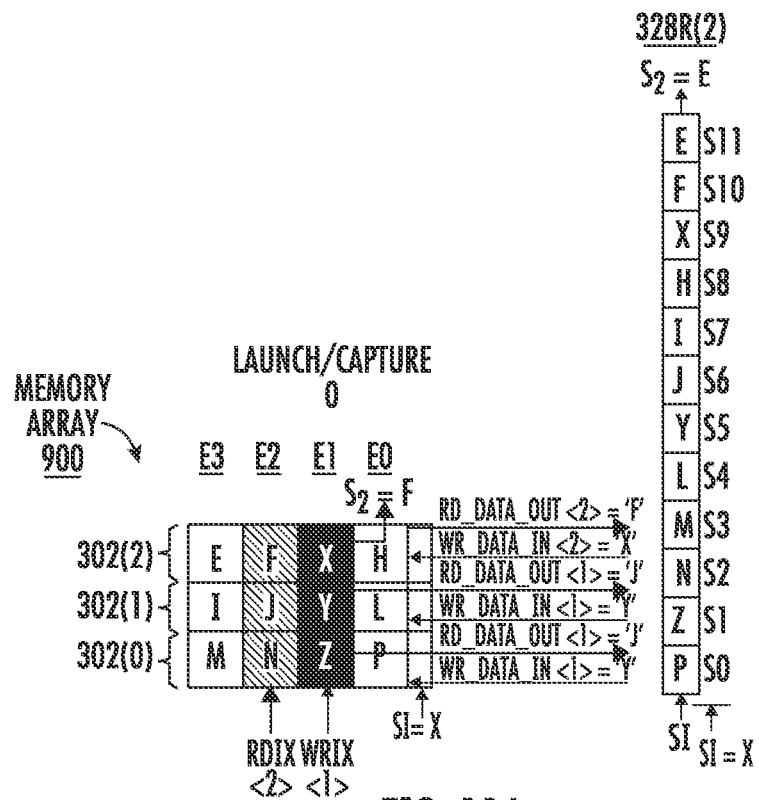
Figure 11B:
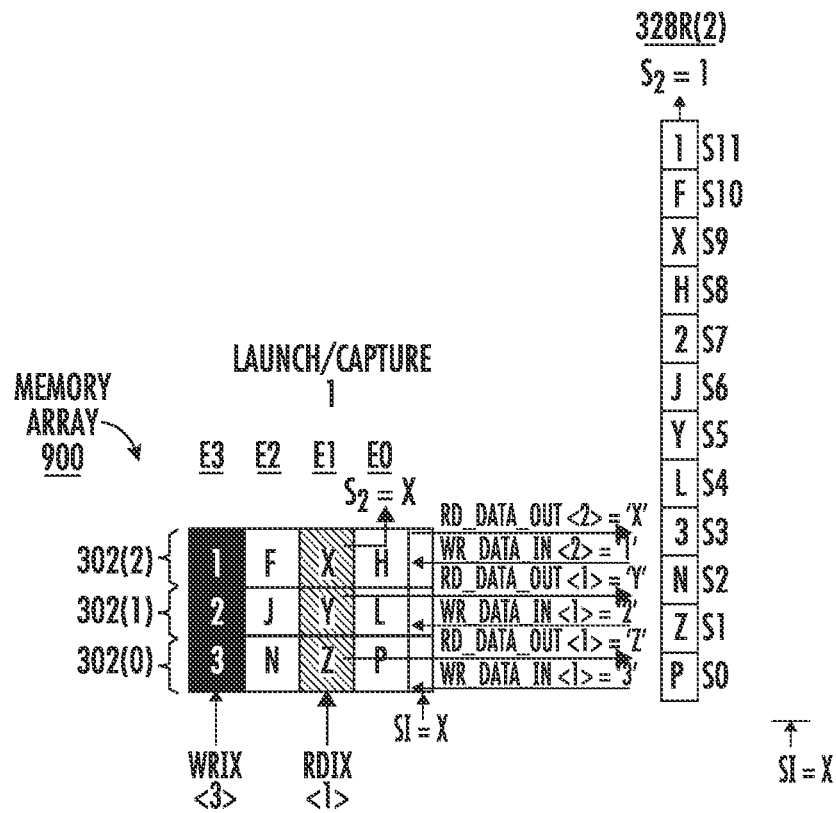
Figure 12:
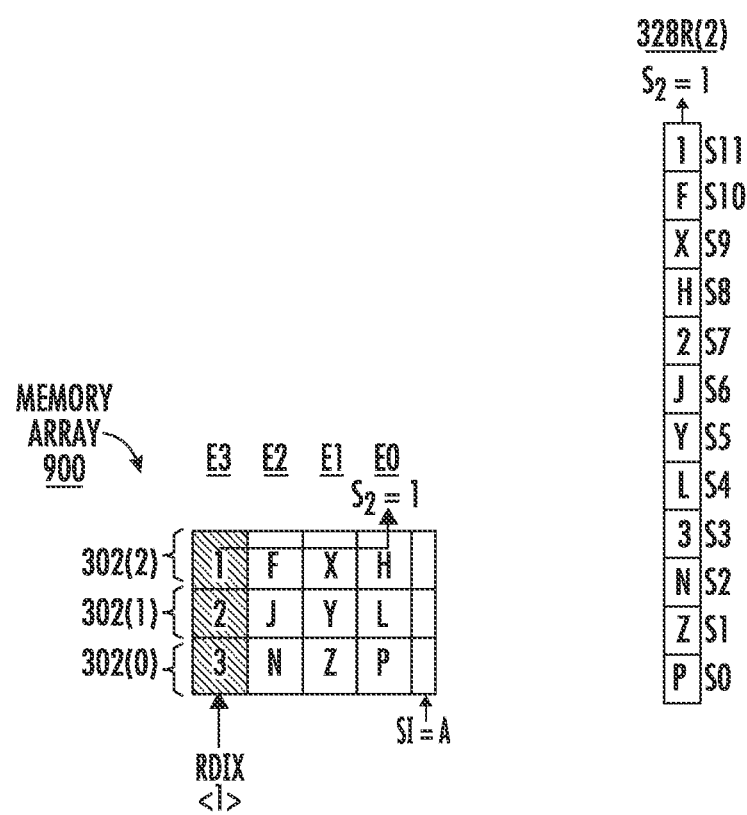
Figure 14:
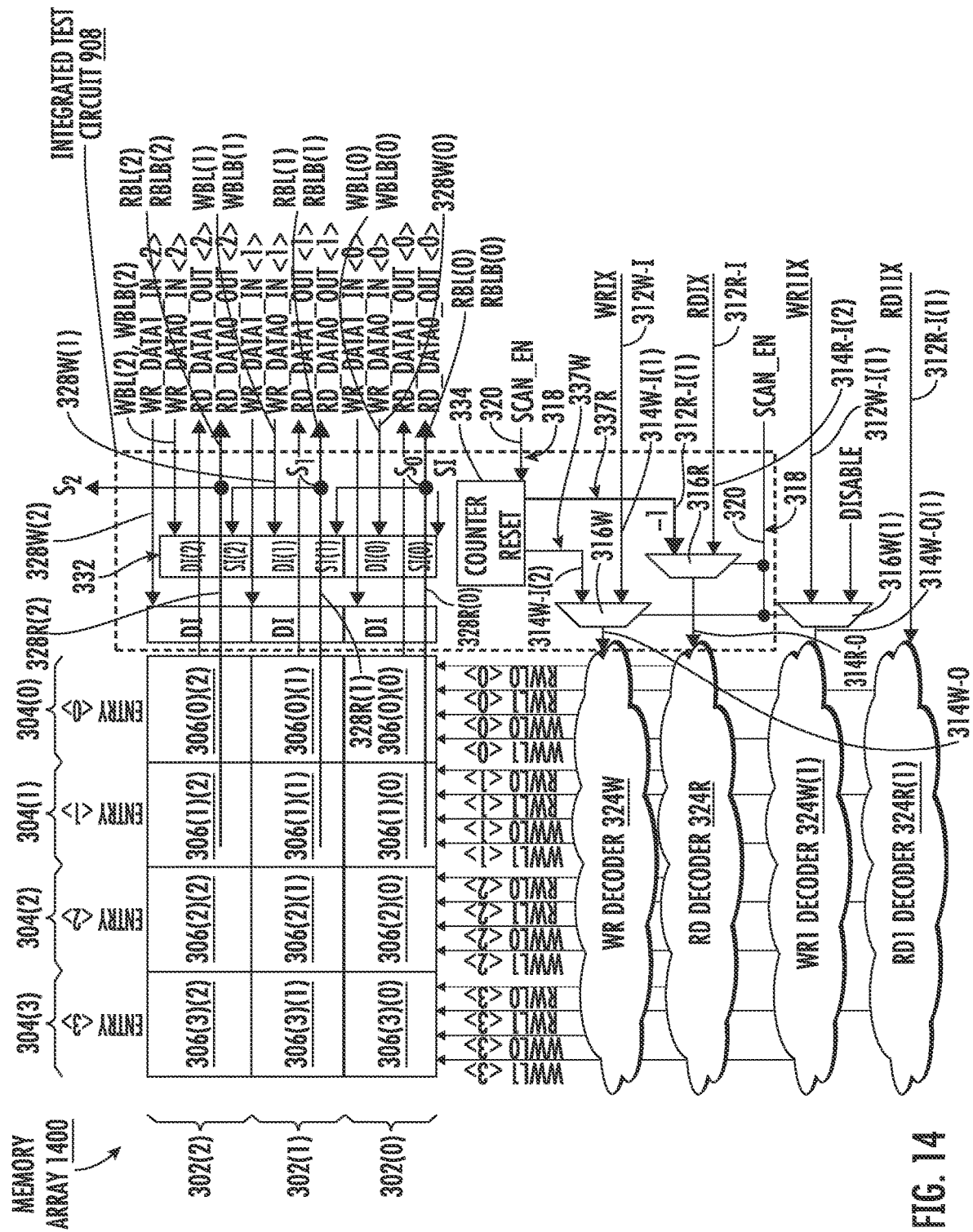
Figure 15A:
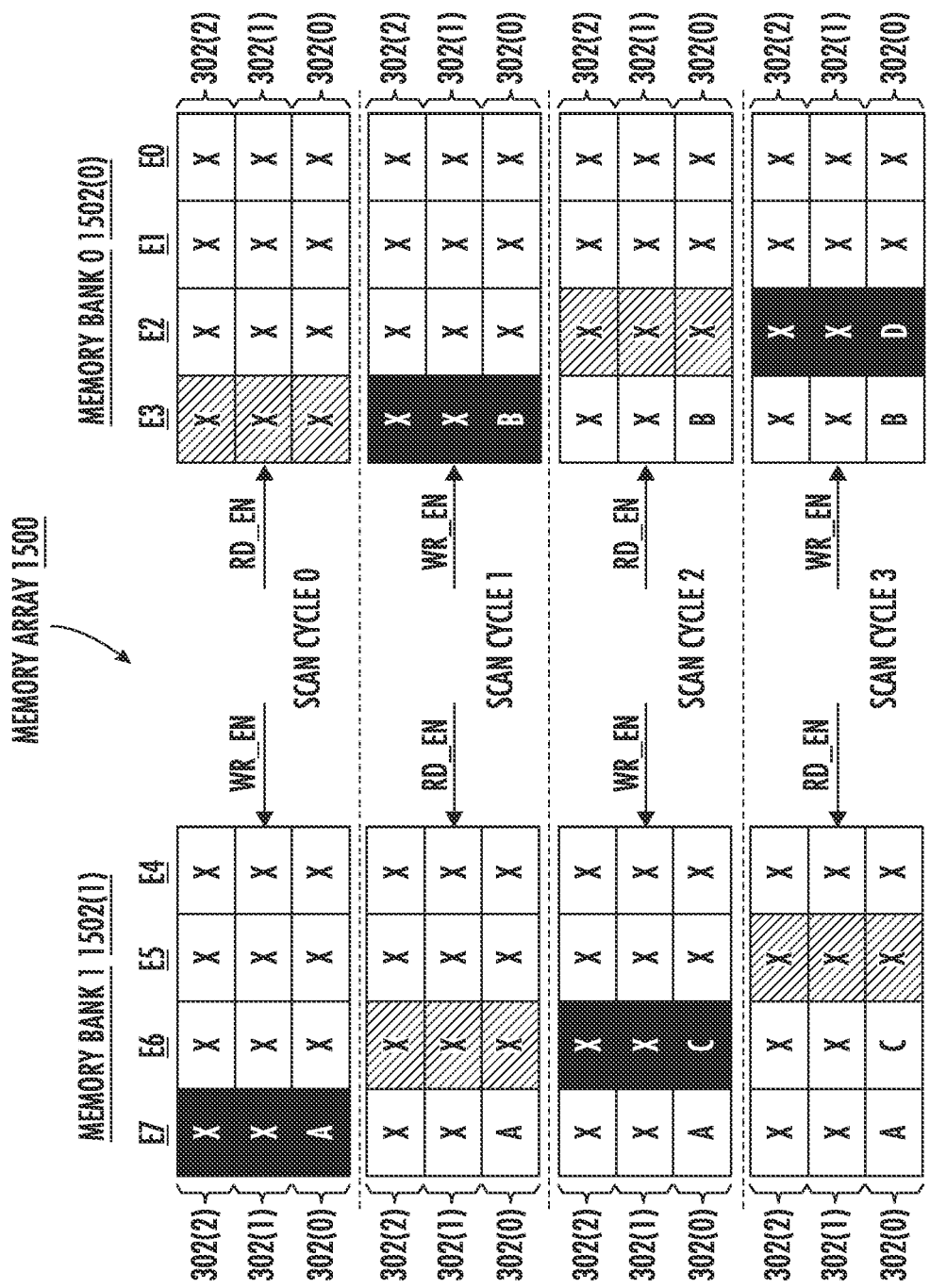
Figure 15B:
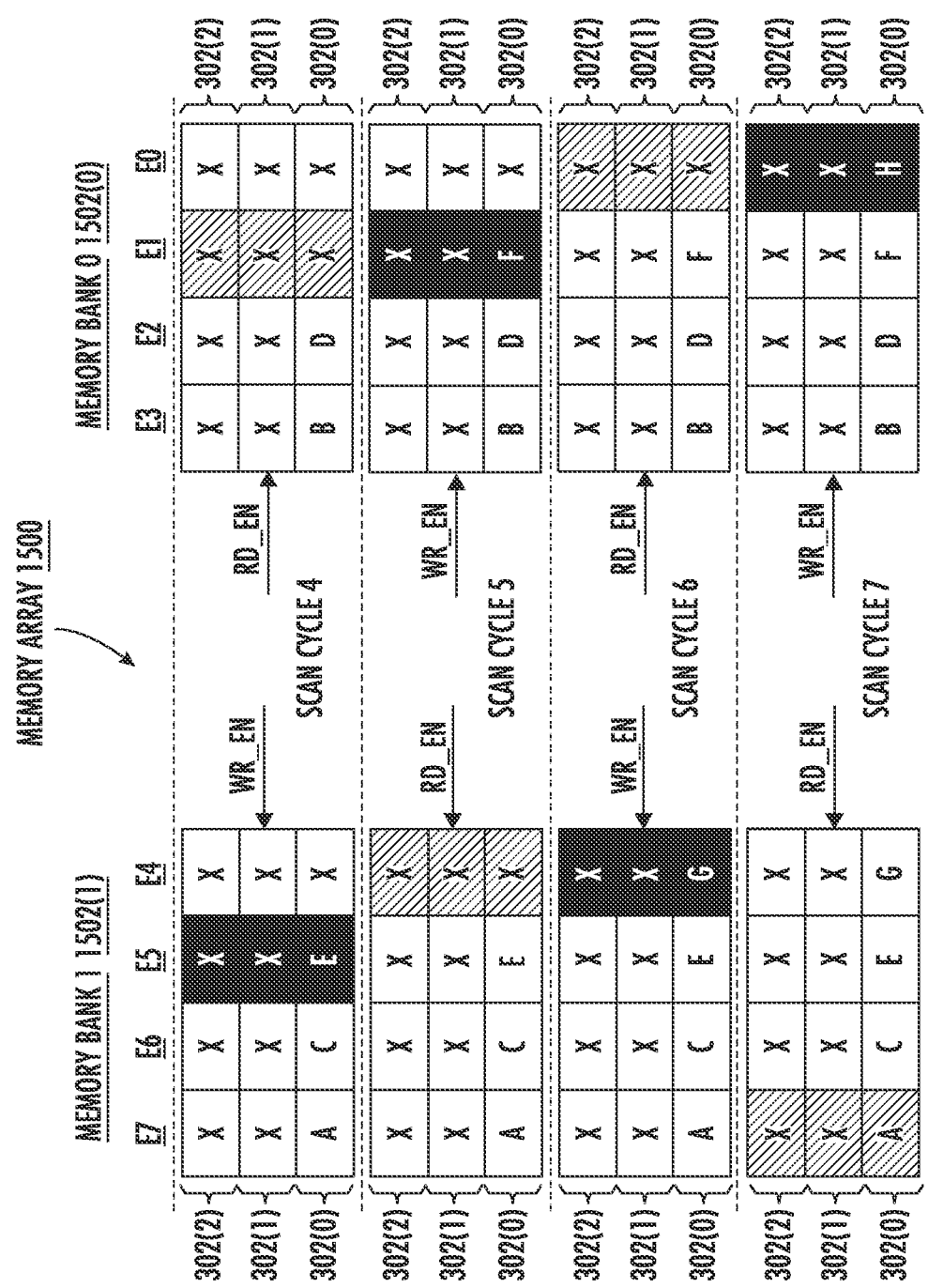

FIGS. 11A and 11B are block diagrams illustrating data states of entries in the memory array in FIG. 9 over respective consecutive scan cycles in a launch/capture phase, based on the received parallelized test data in FIGS. 10A-10L;

FIG. 12 is a block diagram illustrating a data state of entries in the memory array in FIG. 9 in a scan dump mode in a scan;

FIGS. 13A-13D are block diagrams illustrating a simultaneous initialization of entries by the integrated test circuit in the memory array with received serialized test data and scan dump from the state of the memory array in FIG. 12 over respective consecutive scan cycles in a scan mode;

FIG. 14 is a block diagram of another exemplary memory array that can be controlled to provide a virtualized scan chain, wherein the memory array that includes a plurality of memory rows circuits that include a plurality of memory bit cells as entries that can be randomly accessed through multiple write ports and multiple read ports, and wherein the memory array also includes an integrated test circuit configured to cause the entries in the multiple memory row circuits in the memory array to function as a virtualized scan chain in a scan mode, and also allowing the entries in the multiple memory row circuits in the memory array to be randomly accessed in a non-scan, functional mode;

FIGS. 15A and 15B are block diagrams illustrating a memory array that can be controlled to provide a virtualized scan chain, wherein the memory array includes multiple memory banks, wherein each memory bank only includes a single access port, and wherein memory array includes an integrated test circuit configured to cause the entries in the multiple memory row circuits in the multiple memory banks to function as a virtualized scan chain in a scan mode, and also allowing the entries in the multiple memory row circuits in the multiple memory banks to be randomly accessed in a non-scan, functional mode; and FIG. 16 is a block diagram of an exemplary processor-based system that includes a computing system that includes one or more memory systems for storing data, wherein any of the memory systems can include a memory array that can be controlled to provide a virtualized scan chain, wherein the memory array includes access entries that can be randomly accessed, and also includes an integrated test circuit configured to cause entries in the memory array to function as a virtualized scan chain in a scan mode, and also allowing the entries in the memory array to be randomly accessed in a non-scan, functional mode.

DETAILED DESCRIPTION

Aspects disclosed herein include virtualized scan chain testing in a random access memory (RAM) array. Related methods and computer-readable media are also disclosed. The memory array can be included in a memory in a computing system. As a non-limiting example, the memory array may be a static RAM (SRAM) array in a memory system. The memory array may be a cache memory or system memory in a computing system, as non-limiting examples. As another example, the memory array may be a register file, such as a static register file (SRF). The memory array can include at least one memory column of memory bit cells, wherein each memory bit cell in a given memory column is an entry in a corresponding memory row in the memory array. It may be desired to include functionality in the memory array so that the memory array can be modeled as a virtualized scan chain that can be tested with serialized test data/bits (e.g., automatic test program generation (ATPG) data). In this regard, in exemplary aspects, as disclosed in more detail below, to facilitate virtualized scan chain testing in the memory array, the memory array includes an integrated test circuit that is internal to the memory array. In a scan (i.e., test) mode, the integrated test circuit causes the entries in the memory array to be accessed as a serialized scan chain. The integrated test circuit forces addressing of entries in the memory array as a serial chain to write the received serialized test data in a serialized format in the memory array and then shifted within the memory array, the test data eventually being output externally. In this manner, the serialized test data that was written serially into the memory array can be read out also as an output serialized data stream to be compared against the serialized test data in a scan mode to determine if the memory array has functional faults.

Figure 1:
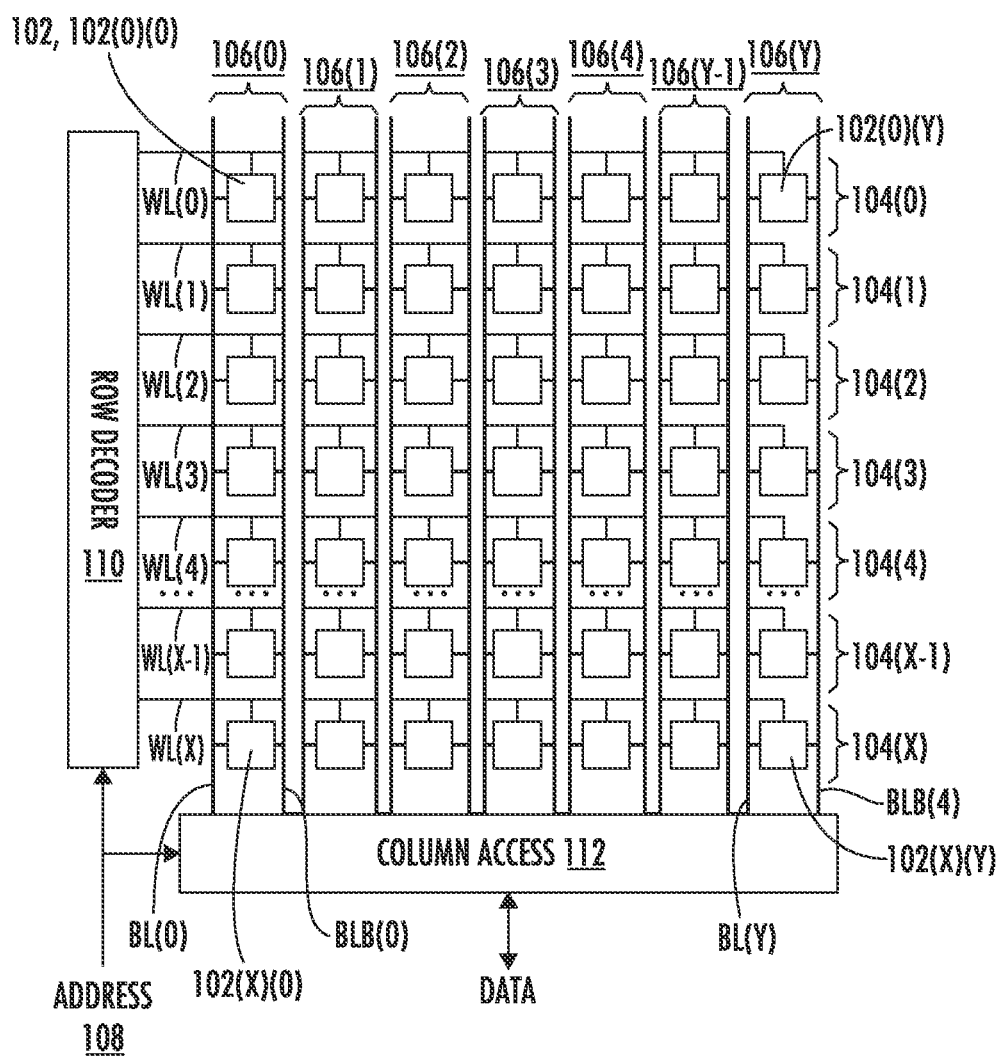
FIG. 1 is a block diagram of an exemplary memory array of random access memory (RAM) bit cells that includes a plurality of memory row circuits each including a plurality of RAM bit cells that each provide a data storage entry in the RAM array, such that the RAM bit cells are organized in respective memory row and memory column circuits.

FIG. 1 is a block diagram of an exemplary memory array 100 that can be included in a computer system to store data for access to execute instructions. As discussed in more detail below, a memory array, like the memory array 100 in FIG. 1, can be controlled to create a virtualized scan chain for scan chain testing the memory array using serialized test data (e.g., ATPG data) as an example. The memory array 100 in FIG. 1 includes memory bit cells circuits 102 (referred to as "memory bit cells 102") organized in memory rows and memory columns. The memory bit cells 102 are organized in 'X+1' memory row circuits 104(0)-104(X). Each memory row circuit 104(0)-104(X) includes a plurality of memory bit cells 102( )(0)-102( )(Y) in over 'Y+1' memory column circuits 106(0)-106(Y). Thus, the memory array 100 includes memory bit cells 102(0)(0)-102(X)(Y). In this example, the memory bit cells 102(0)(0)-102(X)(Y) are static random access memory (SRAM) bit cells that may include a conventional six (6) transistor (T) (6T) based design with cross-coupled inverter circuits whose inputs are controlled by respective pass gate transistors coupled to a respective bit lines BL(0)-BL(Y) and complementary bit lines BLB(0)-BLB(Y) in each memory column circuit 106(0)-106(Y). In another example, the SRAM bit cells 102(0)(0)-102(X)(Y) may be eight (8) transistor (T)(8T) SRAM bit cells with separate read and write ports. In yet another example, the SRAM bit cells 102(0)(0)-102(X)(Y) may be six (6) transistor (T) SRAM bit cells with a single write port and a separate static-logic-based read port (6T-SR). Word lines WL(0)-WL(X) are provided in each memory row circuit 104(0)-104(X) and coupled to the memory bit cells 102(0)(0)-102(X)(Y) in the respective memory row circuit 104(0)-104(X).

To perform a write operation in the memory array 100, a memory address 108 to be written is provided to a row decoder circuit 110. The row decoder circuit 110 decodes the memory address 108 to select the memory row circuit 104(0)-104(X) to be written corresponding to the memory address 108, by activating the word line WL(0)-WL(X) of the selected memory row circuit 104(0)-104(X). Data to be written to the selected memory row circuit 104(0)-104(X) is asserted by a column access circuit 112 on the respective bit lines BL(0)-BL(Y) and complementary bit lines BLB(0)-BLB(Y) to be written in the 'Y+1' columns of the respective memory bit cells 102( )(0)-102( )(Y) in the selected memory row circuit 104(0)-104(X). To perform a read operation in the memory array 100, the respective bit lines BL(0)-BL(Y) and complementary bit lines BLB(0)-BLB(Y) are pre-charged to a pre-charge state by the column access circuit 112. The memory address 108 to be read is provided to the row decoder circuit 110. The row decoder circuit 110 decodes the memory address 108 to select the memory row circuit 104(0)-104(X) to be read by activating the word line WL(0)-WL(X) of the selected memory row circuit 104(0)-104(X). The data stored in the memory bit cells 102( )(0)-102( )(Y) of the selected memory row circuit 104(0)-104(X) are asserted on the respective bit lines BL(0)-BL(Y) and complementary bit lines BLB(0)-BLB(Y), that can be read (e.g., sensed) by the column access circuit 112.

In the memory array 100 in FIG. 1, the memory bit cell circuits 102(0)(0)-102(X)(Y) are not organized as a serialized scan chain, nor can they be programmably configured in a serialized scan chain. The memory bit cells 102( )(0)-102( )(Y) in a given memory row circuit 104(0)-104(X) cannot be programmably connected in a serial manner to an adjacent memory bit cell 102( )(0)-102( )(Y) in the same memory row circuit 104(0)-104(X) by virtue of the design of the memory array 100. Thus, data read from memory bit cells 102( )(0)-102( )(Y) in a given memory row circuit 104(0)-104(X) cannot be controlled through altered circuit paths in a scan mode to be automatically forwarded as input data to be written in an adjacent memory bit cell 102( )(0)-102( )(Y) in the same memory row circuit 104(0)-104(X). And the row decoder circuit 110 and column access circuit 112 as designed do not enable this serialized scan chain connectivity. Thus, to test a memory array 100 like the memory array 100 in FIG. 1, an external BIST circuit is conventionally provided and interfaced to the memory array to scan the memory array according to controlled addressing for write and read operations. However, an external BIST circuit consumes additional die area in the computing system. An external BIST circuit may have an external logic interface to selectively interfaced (e.g., multiplexed) to a number of different memory arrays to be tested. The selective interfacing of the BIST circuit to different memory arrays adds to testing latency.

It may be desired to avoid the need for an external BIST circuit to test the memory array, like the memory array 100 in FIG. 1. A memory array like the memory array 100 in FIG. 1 has the advantage of less complicated memory bit cells that consume less power and die area than, for example, memory cells that employ flip-flop circuits. However, memories that employ flip-flop circuits can more easily to configured in a scan mode in a scan chain by their design. It is desired to create a virtualized scan chain in a random access memory array that is organized in one or more memory columns with one or more memory rows, like the memory array 100 in FIG. 1, to conserve power and die area, like the model shown in FIG. 2. FIG. 2 illustrates a memory array 200 modeled as a virtualized scan chain to be tested with serialized test data 202 (e.g., ATPG data). The serialized test data 202 is input into the memory array as serialized bits over scan cycles. The serialized test data 202 will eventually be output as a serialized test data stream 204 with data bits output from the memory array 200 in the same order as the serialized test data 202 was input into the memory array 200 if the memory array 200 is functioning property.

In this regard, FIG. 3 is a block diagram of an exemplary memory array 300 that is a random access memory array that can be provided in a computing system and that can be randomly accessed to read and write data, but also internally controlled to create a virtualized scan chain for a testing mode. For example, the memory array 300 may be a static register file (SRF). The memory array 300 includes a memory column circuit 302 that includes four (4) respective memory row circuits 304(0)-304(3) each with a memory bit cell circuit 306(0)-306(3) ("memory bit cells 306(0)-306(3)") as a respective entry ENTRY <0>-ENTRY <3>. As discussed below, the entries ENTRY <0>-ENTRY <3> can be randomly addressed and accessed through a selected memory row circuit 304(0)-304(3) with a word line like the memory array 100 in FIG. 1. It may be desired to be test the memory array 300 as a scan chain using serialized test data. However, the memory array 300 includes an integrated test circuit 308 that is configured to cause the memory bit cells 306(0)-306(3) for entries ENTRY <0>-ENTRY <3> in the memory array 300 to function as a virtualized scan chain in a scan mode, while also still allowing the memory bit cells 306(0)-306(3) as entries ENTRY <0>-ENTRY <3> in the memory array 300 to be randomly accessed in a non-scan, functional mode. In this manner, a separate external BIST circuit is not required to test the memory array 300 as a scan chain.

Before discussing the scan mode operation of the memory array 300 in FIG. 3, a non-scan functional mode of the memory array 300 is first discussed. In this regard, in this example, each entry ENTRY <0>-ENTRY <3> has a separate read port and write port for access. This means that separate entries ENTRY <0>-ENTRY <3> can be independently accessed for read and write operations. Thus, as an example, the memory bit cells 306(0)-306(3) may be 8T SRAM bit cells that support separate read and write ports. In this regard, separate read word lines RWL<0>-RWL<3> are coupled to each respective entry ENTRY <0>-ENTRY <3>. Also, separate write word lines WWL<0>-WWL<3> are coupled to each respective entry ENTRY <0>-ENTRY <3>. When it is desired to conduct a read operation in a functional mode, a received read index RDIX as a memory address to be read, is provided. The read index RDIX is received on a read index input 312R-I by the memory array 300 into a first read selector input 314R-I(1) of a read selector circuit 316R. The read selector circuit 316R is a multiplexer circuit in this example. The read selector circuit 316R also has a second read selector input 314R-I(2) that is used for a scan mode as discussed later below. When desired to operate the memory array 300 in a functional mode, a scan enable signal 318 indicating a scan disable state is provided to a scan enable input 320, which causes the read selector circuit 316R (e.g., a multiplexer circuit) to pass the received read index RDIX to a read selector output 314R-O that is coupled to a read decoder input 322R-I of a read decoder circuit 324R. In the scan disable state, the counter returns to and holds a reset/initial state for the write and read values 337W, 337R. The read decoder circuit 324R is configured to decode the received read index RDIX to a decoded read index RDIX-D to enable/activate one of a plurality of the read word lines RWL<0>-RWL<3> corresponding to the read index RDIX to select one of the memory row circuits 304(0)-304(3) for the read access. The read decoder circuit 324R has a plurality of read decoder outputs 326R-O(0)-326R-O(3) that are each coupled to a respective read word line RWL<0>-RWL<3>. The activation of one of the read word lines RWL<0>-RWL<3> causes the respective entry ENTRY <0>-ENTRY <3> coupled to such read word line RWL<0>-RWL<3> to be indexed to then output its stored read output data 328R to a common read bit line RBL (and complementary read bit line RBLB if configured as such) to a coupled read data output RD_DATA_OUT, $S_O$. The read bit line RBL (and complementary read bit line RBLB if configured as such) are coupled to each of the entries ENTRY <0>-ENTRY <3> in the memory column circuit 302.

Note, as examples, that if the entries ENTRY <0>-ENTRY <3> are SRAM bit cells like in this example, the entries ENTRY <0>-ENTRY <3>, the SRAM bit cells can be implemented as static read logic or based on a differential logic that includes complementary nodes and bit lines.

With continuing reference to FIG. 3, when it is desired to conduct a write operation to the memory array 300 in a functional mode, a received write index WRIX as a memory address to be written is provided and received on a write index input 312W-I by the memory array 300. The write index WRIX is coupled to a first write selector input 314W-I(1) of a write selector circuit 316W (e.g., a multiplexer circuit). The scan enable signal 318 indicating a scan disable state causes the write selector circuit 316W to pass the received write index WRIX to a write selector output 314W-O that is coupled to a write decoder input 322W-I of a write decoder circuit 324W. The write decoder circuit 324W is configured to decode the received write index WRIX into a decoded write index WRIX-D to activate/enable one of a plurality of the write word lines WWL<0>-WWL<3> to select one of the memory row circuits 304(0)-304(3) corresponding to the write index WRIX for the write access. The write decoder circuit 324W has a plurality of write decoder outputs 326W-O(0)-326W-O(3) that are each coupled to a respective write word line WWL<0>-WWL<3>. The activation of one of the write word lines WWL<0>-WWL<3> causes the respective entry ENTRY <0>-ENTRY <3> coupled such write word line WWL<0>-WWL<3> to be indexed. The received write input data 328W on a write data input WR_DATA_IN is then written to the entry ENTRY <0>-ENTRY <3> in the selected memory row circuit 304(0)-304(3). The received write input data 328W is asserted on a write bit line WBL (and complementary read bit line WBLB if configured as such). The write bit line WBL (and complementary read bit line WBLB if configured as such) are coupled to each of the entries ENTRY <0>-ENTRY <3> in the memory column circuit 302.

In this example, the integrated test circuit 308 includes a column latch circuit 330 that includes a write latch circuit 332F coupled to the write data input WR_DATA_IN. The write latch circuit 332F is configured to latch the received write input data 328W to be provided to the entry ENTRY <0>-ENTRY <3> in the selected memory row circuit 304(0)-304(3) to be written. As will be discussed in more detail below, the column latch circuit also includes another write latch circuit 332S that is configured to receive a serialized test data stream SIS in a scan mode to be written into the entries ENTRY <0>-ENTRY <3>.

With continuing reference to FIG. 3, the integrated test circuit 308 can also be configured in a scan mode to cause the memory array 300 and its entries ENTRY <0>-ENTRY <3> to behave as a virtualized scan chain. In this manner, the integrated test circuit 308 functions internally to the memory array 300 to cause the memory array 300 to behave a virtualized scan chain like the scan chain model shown for the memory array 200 in FIG. 2. In this regard, as shown in FIG. 3 in this example, the integrated test circuit 308 includes a counter circuit 334 to control internally indexing of the entries ENTRY <0>-ENTRY <3> as a scan chain. The counter circuit 334 is clocked by a clock signal CLK. The counter circuit 334 includes a scan enable input 336 configured to receive the scan enable signal 318. In response to the scan enable signal 318 indicating a scan enable state, the counter circuit 334 is configured to generate a write value 337W on a write counter output 338W-O to the second write selector input 314W-I(2). Also, in response to the scan enable signal 318 indicate a scan enable state in a scan mode, the counter circuit 334 is configured to generate a read value 337R on a read counter output 338R-O to the second read selector input 314R-I(2). The counter circuit 334 may be configured to generate the write and read values 337W, 337R in response to a rising edge of the clock signal CLK. In this example, as discussed in more detail below, the counter circuit 334 is configured to generate the read value 337R at an offset value (e.g., a fixed offset value) from the write value 337W (e.g., by incrementing or decrementing the write value 337W by the offset value) to purposefully link the read and write indexing into the entries ENTRY <0>-ENTRY <3> for read and write operations in a scan mode together by the offset value. In this example, the counter circuit 334 is configured to generate the read value 337R as a −1 increment of the write value 337W. Note that the term "increment" or "decrement" can mean to increase or decrease an integer value herein. Thus, in a scan mode, when the scan enable signal 318 is in a scan enable state, the generated write value 337W and read value 337R are coupled to the respective write and read selector inputs 314W-I(2), 314R-I(2). The scan enable signal 318 being in a scan enable state causes the write selector circuit 316W and read selector circuit 316R to pass the write value 337W and read value 337R to the respective write and read decoder circuits 324W, 324R to be decoded. Thus, in a scan mode, the write value 337W and read value 337R are internally generated write and read indexes into the memory array 300, as opposed to random write and read indexes WRIX, RDIX received from an external source. Because the write value 337W and read value 337R are offset from each other, this causes the write and read decoder circuits 324W, 324R to generate the decoded write index WRIX-D and decoded read index RDIX-D to activate a respective write word line WWL<0>-WWL<3> and read word line RWL<0>-RWL<3> in different memory row circuits 304(0)-304(3) by the same offset value. A next data bit from the serialized test data stream SIS received on the write data input WR_DATA_IN and latched into the write latch circuit 332S is written into the selected entry ENTRY <0>-ENTRY <3> according to the write value 337W generated by the counter circuit 334. The write latch circuit 332S may also be clocked by the clock signal CLK (e.g., on the falling edge of the clock signal CLK). The selected entry ENTRY <0>-ENTRY <3> according to the read value 337R is output as the read output data 328R to the read data output RD_DATA_OUT, $S_O$. Thus, note that the counter 334 generating the read value 337R as an integer to be offset from the write value 337W as another integer to control the reading and writing of the entries ENTRY <0>-ENTRY <3> can be thought of as implement a time offset in the scan mode. In other words, an entry ENTRY <0>-ENTRY <3> is read in a scan cycle, and then that same entry ENTRY <0>-ENTRY <3> is written in a next, subsequent scan cycle in this example.

The counter circuit 334 increments/decrements the write and read values 337W, 337R each scan cycle to repeat write and read operations in a serial manner as part of a virtualized scan chain operation. In this manner, the integrated test circuit 308 supports the writing of the serialized test data stream SIS into the entries ENTRY <0>-ENTRY <3> serially as a scan chain as well as supports the reading of existing data into adjacent entries ENTRY <0>-ENTRY <3> serially to then be shifted as will be discussed in more detail below. After the entries ENTRY <0>-ENTRY <3> are fully as being initialized with data serialized test data stream SIS, the read output data 328R should match the serialized chain of data from the serialized test data stream SIS. Thus, in this example, since there are four (4) entries ENTRY <0>-ENTRY <3>, the read output data 328R on the read data output RD_DATA_OUT, $S_O$ should match the serialized chain of data from the serialized test data stream SIS after four (4) scan cycles.

Note that in the scan mode, the offset used by the counter 334 to generate the read value 337R with respect to the write value 336W can be a fixed offset value, but does not have to be a fixed offset value. The scan mode could be performed by in non-fixed ordering. In an example, the read value 337R can be generated to be any offset from the write value 336W in each scan cycle as long as the write value 337W and read value 337R are not the same value in a given scan cycle. The offset value could also be programmed to be changed for a given scan cycle, if desired.

After the scanning is completed or desired to be halted, the scan enable signal 318 can be set to a scan disable state. This will cause the counter circuit 334 in the integrated test circuit 308 to discontinue the generation of the write value 337W and read value 337R to be input to the write selector circuit 316W and read selector circuit 316R. In the scan disable state, the counter returns to and holds a reset/initial state for the write and read values 337W, 337R. The scan enable signal 318 being in a scan disable state will also cause the read and write selector circuits 316R, 316W to not pass the read and write values 337R, 337W to the read and write decoder circuits 324R, 324W, but rather the read and write indexes RDIX, WRIX received from an external source. In this manner, the memory array 300 can be returned to a functional mode, when desired, where random indexing into the memory array 300 for read and write operations can be controlled through the externally provided read and write indexes RDIX, WRIX. Also, as will also be discussed in more detail below, the integrated test circuit 308 can also be placed into a launch/capture mode that operates similar to the functional mode with random indexed write operations through the externally provided read and write indexes RDIX, WRIX, with the read operation coordinated with the write operation like in a scan mode.

To explain exemplary operation of the integrated test circuit 308 in the memory array 300 in FIG. 3 is a scan mode to create a virtualized scan in the memory array 300, FIGS. 4A-4D are provided. FIGS. 4A-4D are block diagrams illustrating data states of the entries ENTRY <0>-ENTRY <3> in the memory array 300 in FIG. 3 based on received serialized test data from the serialized test data stream SIS over respective consecutive scan cycles to initialize the entries ENTRY <0>-ENTRY <3>.

In this regard, as shown in a first scan cycle 0 in a scan mode in FIG. 4A, a first bit of data 'A' from the received serialized test data stream SIS is written into entry 3 E3 (for ENTRY <3>). 'X's are shown stored in entries 2-0 E2-E0 (for ENTRY <2>-ENTRY <0>), because the data is treated therein as unknown at this time as part of the scan mode as a result of the memory array 300 not being fully initialized. The data 'A' is written into entry 3 E3 based on the counter circuit 334 in the integrated test circuit 308 in FIG. 3 generating a write value 337W that generates a write index WRIX<3> for the third memory row circuit 304(3) to be selected for the write operation to entry 3 E3. As also shown in FIG. 4A, the counter circuit 334 also generates the read value 337R to generate read index RDIX<2> offset by one (1) entry value from the write value 337W for the memory row circuit 304(2) in this example to automatically be selected in the first scan cycle 0 for a read operation to entry 2 E2. Thus, in this example, in scan cycle 0, the next data bit in the received serialized test data stream SIS is written into entry 3 E3 while the data is entry 2 E2 is read to be generated as the next read output data 328R on the read data output RD_DATA_OUT, $S_O$ (see FIG. 3). Once the memory array 300 is full with written data from the serialized test data stream SI, the read index RDIX generated based on the read value 337R from the counter circuit 334 will then start shifting out the serialized test data stream SIS stored in the entries E3-E0 in the order received.

FIG. 4A also shows the entries E3-E0 in a serialized format S3-S0 as the memory array 300 appears as a virtualized scan chain. Unknown 'X' data is shown as being shifted out as the next output read data $S_O$, because the memory array 300 is still not yet fully initialized with data from the serialized test data stream SI.

As shown in a next scan cycle 1 in the scan mode in FIG. 4B, a second bit of data 'B' from the received serialized test data stream SIS is written into entry 2 E2. 'X's are shown stored in entries 1-0 E1-E0, because the data therein is still unknown at this time as part of the scan mode as a result of the memory array 300 not being fully initialized. The data 'B' is written into entry 2 E2 based on the counter circuit 334 in the integrated test circuit 308 in FIG. 3 generating a next, incremented write value 337W of '2' that generates a write index WRIX<2> for the second memory row circuit 304(2) to be selected for the write operation to entry 2 E2. As also shown in FIG. 4B, the counter circuit 334 also increments the read value 337R, by the offset value with regard to the write value 337W, to generate read index RDIX<1> for the memory row circuit 304(2) to automatically be selected in the scan cycle 1 for a read operation to entry 1 E1. FIG. 4B also shows the entries E3-E0 in a serialized format S3-S0 as the memory array 300 appears as a virtualized scan chain. Unknown 'X' data is still shown as being shifted out as the next output read data $S_O$, because the memory array 300 is still not yet fully initialized with data from the serialized test data stream SI.

As shown in a next scan cycle 2 in the scan mode in FIG. 4C, a third bit of data 'C' from the received serialized test data stream SIS is written into entry 1 E1. 'X's are shown stored in entry 0 E0, because the data therein is still unknown at this time as part of the scan mode as a result of the memory array 300 not being fully initialized. The data 'C' is written into entry 1 E1 based on the counter circuit 334 in the integrated test circuit 308 in FIG. 3 generating a next, incremented write value 337W of '1' that generates a write index WRIX<1> for the memory row circuit 304(1) to be selected for the write operation to entry 1 E1. As also shown in FIG. 4C, the counter circuit 334 also increments the read value 337R, by the offset value with regard to the write value 337W, to generate read index RDIX<0> for the memory row circuit 304(0) to automatically be selected in the scan cycle 2 for a read operation to entry 0 E0. FIG. 4C also shows the entries E3-E0 in a serialized format S3-S0 as the memory array 300 appears as a virtualized scan chain. Unknown 'X' data is still shown as being shifted out as the next read output data 328R on the RD_DATA_OUT, $S_O$, because the memory array 300 is still not yet fully initialized with data from the serialized test data stream SI.

Then, as shown in a next scan cycle 3 in the scan mode in FIG. 4D, a fourth bit of data 'D' from the received serialized test data stream SIS is written into entry 0 E0. The data 'D' is written into entry 0 E0 based on the counter circuit 334 in the integrated test circuit 308 in FIG. 3 generating a next, incremented write value 337W of '0' that generates a write index WRIX<0> for the memory row circuit 304(1) to be selected for the write operation to entry 0 E0. At this time, the memory array 300 is fully initialized in this scan mode, because the memory array 300 is initialized when number of scan cycles equals the number of entries E3-E0. As also shown in FIG. 4D, the counter circuit 334 also decrements the read value 337R, by the offset value with regard to the write value 337W in this example, to generate read index RDIX<3> for the memory row circuit 304(3) to automatically be selected in the scan cycle 2 for a read operation to entry 3 E3. This is because in this instance, the read value 337R overflowed, and the counter circuit 334 reset the read value 337R to '3'. In this manner, this causes data 'A' stored in entry 3 E3 to be read out as next read output data 328R on the RD_DATA_OUT, $S_O$, which was the first bit of data written from the received serialized test data stream SIS in the first scan cycle as shown in FIG. 4A. Thus, by controlling the read index RDIX to be offset by the write index WRIX in this manner for read and write operations in a scan mode, the memory array 300 is controlled so that its entries 3-0 E3-E0 behave like a serialized scan chain.

FIG. 4D also shows the entries E3-E0 in a serialized format S3-S0 as the memory array 300 appears as a virtualized scan chain. The next read output data 328R can be compared serially to the corresponding bit data in the serialized test data stream SIS at this point in the scan mode to see if 'A' stored in entry 3 E3 matches 'A' from the serialized test data stream SI.

The scan cycles of the scan mode can be continued to be performed, with the counter circuit 334 incrementing/decrementing the write and read values 337W, 337R. This causes the memory array 300 to index entries 3-0 E3-E0 to write next data received from the serialized test data stream SIS while also reading out data stored in an adjacent entry 3-0 E3-E0 that was previously written as next read output data 328R on RD_DATA_OUT, $S_O$. The next read output data 328R can continue to be compared serially over the scan cycles to the serialized test data stream SI.

The memory array 300 and its integrated test circuit 308 can also be configured to operate in a launch/capture mode to have the ability to randomly write test data to the memory array 300 in launch/capture cycles. Note that the launch/capture mode is a functional mode for the memory array 300. In the launch/capture mode, the randomly written test can then be read out from the same written entry in a next launch/capture cycle and verified. In the launch/capture mode, the read index RDIX (see FIG. 3) is controlled to be set to the write index WRIX of the previous launch/capture cycle. In this manner, the test data that was written to the memory array 300 in one launch/capture cycle is automatically read out in a subsequent, next launch/capture cycle. New test data can be written to another entry in the memory array 300 at the same time in the next launch/capture cycle. This is shown by the example in FIGS. 5A and 5B discussed below. Note that in the launch/capture mode, the scan enable signal 318 is set to scan disable mode so that the counter circuit 334 is not forced generate the write values 337W consecutively to generate the write index WRIX as a serialized scan chain.

FIG. 5A shows an exemplary state of the memory array 300 and its entries E3-E0 in a first launch/capture cycle 0. As shown in FIG. 5A, entries E3-E0 contain respective data 'M', 'N', 'Z', and 'P'. For example, entry 1 E1 may have previously contained data 'O'. As shown in FIG. 5A, the write index WRIX (see FIG. 3) was set to entry 1 E1 to write data 'Z' on the write data input WR_DATA_IN to entry 1 E1. The read index RDIX is set to '2' to read entry 2 E2 to be read out on the read data output RD_DATA_OUT, $S_O$ as 'N'. For example, entry 2 E2 may have been written in a previous launch/capture cycle before the launch/capture cycle 0 shown in FIG. 5A. FIG. 5A also shows the entries 3-0 E3-E0 in a serialized format S3-S0 as the memory array 300 appears as a virtualized scan chain.

Then, as shown in FIG. 5B in this example, in a next launch/capture cycle 1 of the launch/capture mode, because entry 1 E1 was written in the previous launch/capture cycle 0 in FIG. 5A, the read index RDIX is set to entry 1 E1 to now read out the data 'Z' from entry 1 E1 on the read data output RD_DATA_OUT, $S_O$ as 'Z'. The write index WRIX is set to the next entry (entry 3 E3 in this example) according to the setting of the write index WRIX as a random access to write next text data '3' into entry 3. FIG. 5B also shows the entries E3-E0 in a serialized format S3-S0 as the memory array 300 appears as a virtualized scan chain. Although not shown, additional launch/capture cycles can be performed to write new data into an entry 3-0 E3-E0 as a random access while reading out the previously written data in a next launch/capture mode.

Then, as shown in FIG. 6, the integrated test circuit 308 in the memory array 300 in FIG. 3 can be set to a scan dump mode, if desired. As shown in FIG. 6, in this example, the counter circuit 334 sets the read value 337R to '1' so that entry 3 E3 will be read out as the read output data 328R on read data output RD_DATA_OUT, $S_O$ in a scan dump mode. In a scan dump mode, serialized write operations can occur to initialize other entries 3-0 E3-E0 that are not being read in the same cycle as part of the scan chain, but are not required. As previously discussed and as shown in the example scan cycles in a scan mode in FIGS. 4A-4D, subsequent scan cycles can read out data from entries 3-0 E3-E0 one at a time in each scan cycle as a scan chain according to the read value 337R generated by the counter circuit 334 and incremented each scan cycle.

Figure 7A:
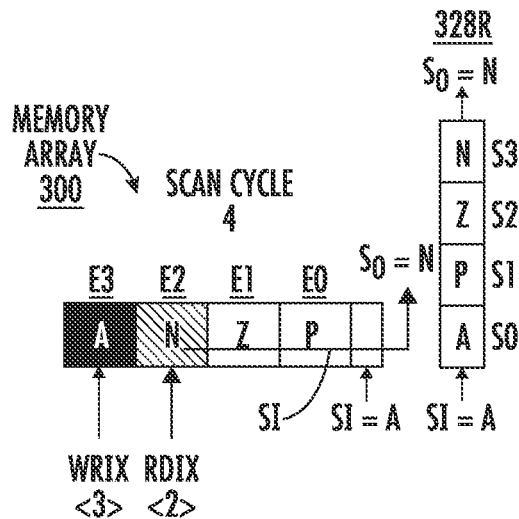

Then, if desired and as shown in examples in FIGS. 7A-7D, the integrated test circuit 308 can be configured to return to the scan mode where data is both written and read from the memory array 300 as a virtualized scan chain in each scan cycle of the scan mode. As shown in scan cycle 4 in the scan mode in FIG. 7A, a next data bit 'A' from the received serialized test data stream SIS on the write data input WR_DATA_IN (FIG. 3) is written into entry 3 E3. Data 'N' previously stored in entry 2 E2 is read out to the read data output RD_DATA_OUT, $S_O$. As previously discussed, the write and read indexes WRIX, RDIX are controlled by the write and read values 337W, 337R generated by the counter circuit 334 as offset from each other by an offset value (see FIG. 3). FIG. 7A also shows the entries E3-E0 in a serialized format S3-S0 as the memory array 300 appears as a virtualized scan chain.

Figure 7B:
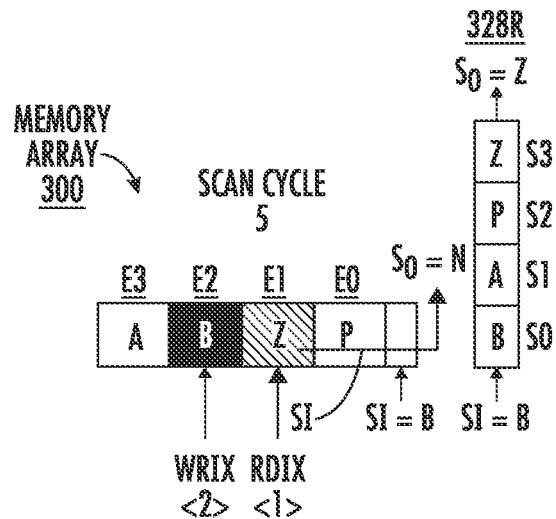
Figure 7C:
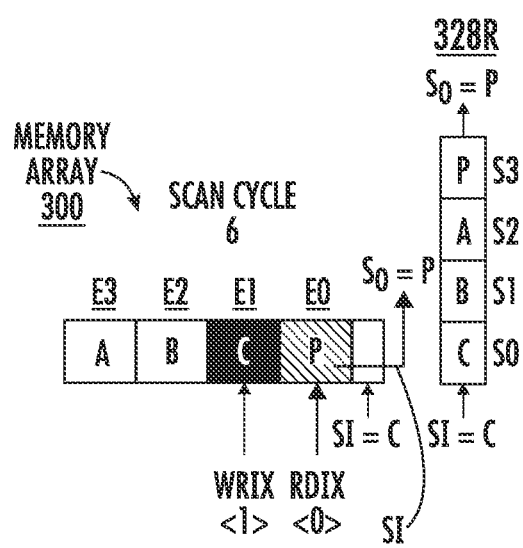
Figure 7D:
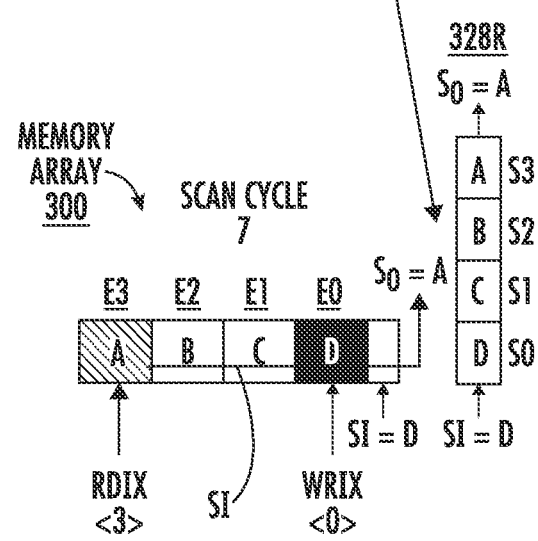

As shown in scan cycle 5 in the scan mode in FIG. 7B, a next data bit 'B' from the received serialized test data stream SIS on the write data input WR_DATA_IN (FIG. 3) is written into entry 2 E2. Data 'Z' previously stored in entry 1 E1 is read out to the read data output RD_DATA_OUT, $S_O$. FIG. 7B also shows the entries E3-E0 in a serialized format S3-S0 as the memory array 300 appears as a virtualized scan chain. As shown in scan cycle 6 in the scan mode in FIG. 7C, a next data bit 'C' from the received serialized test data stream SIS on the write data input WR_DATA_IN (FIG. 3) is written into entry 1 E1. Data 'P' previously stored in entry 0 E0 is read out to the read data output RD_DATA_OUT, $S_O$. FIG. 7C also shows the entries E3-E0 in a serialized format S3-S0 as the memory array 300 appears as a virtualized scan chain. As shown in scan cycle 7 in the scan mode in FIG. 7D, a next data bit 'D' from the received serialized test data stream SIS on the write data input WR_DATA_IN (FIG. 3) is written into entry 0 E0. Data 'A' previously stored in entry 3 E3 is read out to the read data output RD_DATA_OUT, $S_O$, which can then be compared to the serialized test data stream SI. FIG. 7D also shows the entries E3-E0 in a serialized format S3-S0 as the memory array 300 appears as a virtualized scan chain.

FIG. 8 is a flowchart illustrating an exemplary scan mode process 800 of an integrated test circuit 308 in a memory array, such as memory array 300 in FIG. 3, performing write and read operations to cause the memory array to function as a virtualized scan chain in a scan mode. The scan mode process 800 in FIG. 8 will be described with regard to the example in FIG. 3, but such is not limiting.

In this regard, as shown in FIG. 8, a first step in the scan mode process 800 is receiving a next write input data SI from a serialized test data stream SIS (block 802 in FIG. 8). A next step in the scan mode process 800 is generating a next write value 337W (block 804 in FIG. 8). A next step in the scan mode process 800 is generating a next read value 337R offset from the next write value 337W by an offset value (block 806 in FIG. 8). A next step in the scan mode process 800 is indexing at the next write value 337W, a first memory row circuit 304(0)-304(3) of a plurality of memory row circuits 304(0)-304(3) in a first memory column circuit 302, the first memory column circuit 302 comprising a plurality of memory bit cells 306(0)-306(3) each contained in a respective memory row circuit 304(0)-304(3) of the plurality of memory row circuits 304(0)-304(3) (block 806 in FIG. 8). A next step in the scan mode process 800 is indexing a second memory row circuit 304(0)-304(3) of the plurality of memory row circuits 304(0)-304(3) at the next read value 337R (block 810 in FIG. 8). A next step in the scan mode process 800 is writing the next write input data SI to a first memory bit cell 306(0)-306(3) of the plurality of memory bit cells 306(0)-306(3) in the indexed first memory row circuit 304(0)-304(3) (block 812 in FIG. 8). A next step in the scan mode process 800 is reading a next read output data 328R stored in the second memory bit cell 306(0)-306(3) of the plurality of memory bit cells 306(0)-306(3) in the indexed second memory row circuits 304(0)-304(3), on a read data output RD_DATA_OUT, $S_O$ (block 814 in FIG. 8).

It is also possible to provide a memory array that has multiple memory column circuits, like the memory array 100 in FIG. 1, and whose memory row circuits can be controlled to function as a virtualized scan chain in a scan mode. The memory bit cells in the memory column circuits can be controlled to operate in a serialized manner as if all the outputs of each memory bit cell were physically connected to the inputs of adjacent memory bit cells in the memory array. For example, if a memory array has three (3) memory column circuit each containing four (4) memory bit cells, the memory array can be controlled such that the memory bit cells are serialized to create a virtualized scan chain consisting of twelve (12) memory bit cells.

In this regard, FIG. 9 is a block diagram of another exemplary memory array 900 that is a random access memory array that can be used to store data in a computing system and that can be controlled to operate as a virtualized scan chain. The memory array 900 in FIG. 9 is similar to the memory array 300 in FIG. 3, but the memory array 900 includes a plurality of the memory column circuits, instead of a single memory column circuit like in the memory array 300 in FIG. 3. For example, the memory array 300 may be a static register file (SRF). Common elements between the memory array 300 in FIG. 3 and the memory array 900 in FIG. 9 are shown with common element numbers and not re-described.

With reference to FIG. 9, the memory array 900 in this example includes three (3) memory column circuits 302(0)-302(2) that each include four (4) respective memory row circuits 304(0)-304(3). Thus, there are twelve (12) total memory bit cells 306(0)(0)-306(3)(2) in the memory array 900. The respective memory bit cells 306(0)(0)-306(0)(2), 306(1)(0)-306(1)(2), 306(2)(0)-306(2)(2), 306(3)(0)-306(3)(2) in each respective memory row circuit 304(0)-304(3) constitutes a respective entry ENTRY <0>-ENTRY <3> in the memory array 900, wherein each entry ENTRY <0>-ENTRY <3> is 3 bits wide. Each entry ENTRY <0>-ENTRY <3> can be randomly addressed and accessed through a selected memory row circuit 304(0)-304(3) with a respective word line in a functional mode. Like the memory array 300 in FIG. 3, it may be desired to test the memory array 900 as a scan chain in a scan mode using serialized test data, without the need for a separate external BIST circuit to test the memory array 300 while also being to access the memory array 900 in a functional mode where the entries ENTRY <0>-ENTRY <3> in the respective memory row circuits 304(0)-304(3) are accessed randomly for read and write operations.

Before discussing the scan mode operation of the memory array 900 in FIG. 9, the non-scan functional mode of the memory array 900 is first discussed. In this regard, in this example, each entry ENTRY <0>-ENTRY <3> has a separate read port and write port for access, meaning entry ENTRY <0>-ENTRY <3> can be independently accessed for read and write operations. Thus, as an example, the memory bit cells 306(0)(0)-306(3)(2) may be 8T SRAM bit cells that support separate read and write ports. When it is desired to conduct a read operation in a functional mode, a received read index RDIX as a memory address to be read is provided and received on a read index input 312R-I like described above in FIG. 3. Like the memory array 300 in FIG. 3, a scan enable signal 318 indicating a scan disable state is provided to a scan enable input 320, which causes the read selector circuit 316R to pass the received read index RDIX to the read selector output 314R-O that is coupled to a read decoder input 322R-I of a read decoder circuit 324R. In the scan disable state, the counter returns to and holds a reset/initial state for the write and read values 337W, 337R. The activation of one of the read word lines RWL<0>-RWL<3> causes the respective entry ENTRY <0>-ENTRY <3> coupled to such read word line RWL<0>-RWL<3> to be indexed and to then output its stored read output data 328R(0)-328R(3) to one of common read bit lines RBL(0)-RBL(2) (and complementary read bit line RBLB(0)-RBLB (2) if configured as such) as three (3) bits to a coupled respective read data outputs RD_DATA_OUT<0>-RD_DATA_OUT<2>.

With continuing reference to FIG. 9, when it is desired to conduct a write operation in a functional mode, a received write index WRIX as a memory address to be written, is provided. The write index WRIX is received on the write index input 312W-I by the memory array 900 into a first write selector input 314W-I(1) of a write selector circuit 316W. The write selector circuit 316W is a multiplexer circuit in this example. In the functional mode, the scan enable signal 318 indicating a scan disable state causes the write selector circuit 316W to pass the received write index WRIX to a read selector output 314R-O that is coupled to the write decoder input 322W-I of a write decoder circuit 324W. The activation of one of the write word lines WWL<0>-WWL<3> by the write decoder circuit 324W causes the respective entry ENTRY <0>-ENTRY <3> coupled to such write word line WWL<0>-WWL<3> to be indexed for received write input data 328W(0)-328W(2) on a write data input WR_DATA_IN<2> as a three (3) bit word to be written to the entry ENTRY <0>-ENTRY <3> in the selected memory row circuit 304(0)-304(3). The received write input data 328W(0)-328W(2) is asserted on a write bit line WBL(0)-WBL(3) (and complementary read bit line WBLB(0)-WBLB(3) if configured as such) that are coupled to each of the entries ENTRY <0>-ENTRY <3> in the respective memory column circuits 302(0)-302(2).

In this example, the integrated test circuit 308 includes three (3) column latch circuits 332(0)-332(2) in each respective memory column circuit 302(0)-302(3), wherein each column latch circuit 330(0)-330(2) includes a write latch circuit 332F(0)-332F(2) coupled to a respective write data input WR_DATA_IN<0>-WR_DATA_IN<2>. The write latch circuits 332F(0)-332F(2) are configured to latch the received write input data 328W(0)-328W(2) to be provided to the entry ENTRY <0>-ENTRY <3> in the selected memory row circuit 304(0)-304(3) to be written. As will be discussed in more detail below, the column latch circuits 330(0)-330(2) also includes write latch circuits 332S(0)-332S(2) that are configured to receive a serialized test data stream SI(0)-SI(2) in a scan mode to be written into the entries ENTRY <0>-ENTRY <3>.

With continuing reference to FIG. 9, the integrated test circuit 908 can also be configured in a scan mode to cause the memory array 900 and its entries ENTRY <0>-ENTRY <3> to behave as a virtualized scan chain. In this manner, the integrated test circuit 908 functions internally to the memory array 900 to cause the memory array 900 to have a virtualized scan chain and to behave like the memory scan chain model for its twelve (12) memory bit cells 306(0)(0)-306(3)(2) like the virtualized scan chain model in FIG. 2. As discussed for the memory array 300 in FIG. 3, in a scan mode, when the scan enable signal 318 is in a scan enable state, the write value 337W and read value 337R are coupled to the respective write and read selector inputs 314W-I(2), 314R-I(2). The scan enable signal 318 being in a scan enable state causes the write selector circuit 316W and read selector circuit 316R to pass the respective write value 337W and read value 337R generated by the counter circuit 334 to the respective write and read decoder circuits 324W, 324R to be decoded. Because the write value 337W and read value 337R are offset from each other, this causes the write and read decoder circuits 324W, 324R to generate the decoded write index WRIX-D and decoded read index RDIX-D to activate a respective write word line WWL<0>-WWL<3> and read word line RWL<0>-RWL<3> in different memory row circuits 304(0)-304(2). A next data bit from the serialized test data stream SIS received on the write data input WR_DATA_IN<0> and latched into the write latch circuit 332S(0) is written into the selected entry ENTRY <0>-ENTRY <3> in the memory column circuit 302(0) according to the write value 337W generated by the counter circuit 334.

The entries ENTRY <0>-ENTRY <3> across all memory column circuits 302(0)-302(2) are written, but only memory column circuit 302(0) is written with the incoming next data bit SI(0) latched in the write latch circuit 332S(0) from the serialized test data stream SIS. As will be discussed in more detail below, the other bits of ENTRY <0>-ENTRY <3> in memory column circuits 302(1)-302(2) are written from previously read data SI(1), SI(2) that was stored in the same memory column circuits 302(1)-302(2) in a lower adjacent memory row circuit 304(0)-304(3) through the coupling of the read data output READ_DATA_OUT<0> to write latch circuit 332S(1), and the coupling of the read data output READ_DATA_OUT<1> to write latch circuit 332S(2). The write latch circuits 332S(1), 332S(2), by their coupling to the read data outputs READ_DATA_OUT<0>, READ_DATA_OUT<1>, are configured to latch data SI(1), SI(2) read from a lower, adjacent memory row circuit 304(0)-304(3) in an immediately prior scan cycle. For example the write latch circuits 332S(0)-332S(2) may be configured to latch read data SI(1)-SI(2) on the falling edge of a clock signal CLK used to clock the counter circuit 334, after the counter increments the write and read values 337W, 337R, to prepare such latched read data SI(1)-SI(2) to then be written in a next clock cycle in a next scan cycle.

In this manner, when a write operation occurs in a scan mode, memory column circuit 302(0) for the current selected entry ENTRY <0>-ENTRY <3> in respective memory row circuit 304(0)-304(3) is written with the next data bit from the serialized test data stream SIS. Memory column circuits 302(1), 302(2) are written with the previously stored data bits in the respective lower adjacent memory column circuit 302(0), 302(1). This has the effect of serially "stitching" together the memory column circuits 302(0)-302(2) and their memory bit cells 306(0)(0)-306(3)(2) serially, so that stored data is serially shifted from the memory bit cells 306(0)(0)-306(0)(2) in memory column circuit 302(0), to memory bit cells 306(1)(0)-306(3)(2) in respective memory column circuits 302(1), 302(2). Eventually, the data bits that are written into memory bit cells 306(3)(0)-306(0)(0) in memory column circuit 302(0) for entries ENTRY <0>-ENTRY <3> will be shifted to the memory bit cells 306(3)(1)-306(0)(1) in the memory column circuit 302(1). Also, data bits that are written into memory bit cells 306(3)(1)-306(0)(1) in memory column circuit 302(1) for entries ENTRY <0>-ENTRY <3> will be shifted to the memory bit cells 306(3)(2)-306(0)(2) in the memory column circuit 302(2). The data shifted to the last memory column circuit 302(2) will be shifted out as next read output data 328R(2) on the read data output RD_DATA_OUT<2>, S2.

Like the memory array 300 in FIG. 3, the counter circuit 334 in the memory array 900 in FIG. 9 increments the write and read values 337W, 337R each scan cycle to repeat write and read operations in a serial manner as part of a scan chain operation. In this manner, the integrated test circuit 908 supports the writing of the serialized test data stream SIS into the memory bit cells 306(0)(0)-306(3)(2) serially as a scan chain as well as supports the reading of existing data into adjacent entries ENTRY <0>-ENTRY <3> serially to then be shifted, as will be discussed in more detail below. After the memory bit cells 306(0)(0)-306(3)(2) in entries ENTRY <0>-ENTRY <3> are fully initialized (i.e., written) with data from the serialized test data stream SIS, the read output data 328R should match the serialized chain of data from the serialized test data stream SIS. Thus, in this example, since there are twelve memory bit cells 306(0)(0)-306(3)(2) in the three (3) entries ENTRY <0>-ENTRY <3>, the read output data 328R(2) on the read data output RD_DATA_OUT<2>, S2 should match the serialized chain of data from the serialized test data stream SIS after twelve (12) scan cycles.

After the scanning is completed or desired to be halted, the scan enable signal 318 can be set to a scan disable state. This will cause the counter circuit 334 in the integrated test circuit 908 to discontinue the generation of the write value 337W and read value 337R to be input to the write selector circuit 316W and read selector circuit 316R. In this manner, the memory array 900 can be returned to a functional mode where random indexing into the memory array 900 for read and write operations can be controlled through the externally provided read and write indexes RDIX, WRIX. As will also be discussed in more detail below, the integrated test circuit 908 can also be placed into a launch/capture mode that operates like the functional mode with random indexed write operations through the externally provided read and write indexes RDIX, WRIX, with the read operation coordinated with the write operation like in a scan mode.

To explain exemplary operation of the integrated test circuit 908 in the memory array 900 in FIG. 9 is in a scan mode, FIGS. 10A-10L are provided. FIGS. 10A-10L are block diagrams illustrating data states of the entries ENTRY <0>-ENTRY <3> in the memory array 900 in FIG. 9 based on received serialized test data in a serialized test data stream SIS over respective consecutive scan cycles to initialize the entries ENTRY <0>-ENTRY <3>.

In this regard, as shown in a first scan cycles 0-3 in a scan mode in FIGS. 10A-10D, first bits of data 'A', 'B', 'C', and 'D' from the received serialized test data stream SIS is written into entries 3-0 E3-E0. 'X's are shown stored in memory column circuits 302(1), 302(2) for entries 3-0 E3-E0, because the data is treated therein as unknown at this time as part of the scan mode as a result of the memory array 900 not being fully initialized. As shown in FIG. 10A, data 'A' is written into memory column circuit 302(0) of entry 3 E3 based on the counter circuit 334 in the integrated test circuit 908 in FIG. 9 incrementing the write value 337W that generates a write index WRIX<3> for entry 3 E3 to be selected for the write operation. As previously discussed, the 'X', 'X' data written into memory column circuits 302(1), 302(2) in entry 3 E3 is a result of a previous read operation from the same memory column circuits 302(1), 302(2) in entry 3 E3 from a prior scan cycle in the scan mode. In the scan cycle 0 in FIG. 10A, 'X', 'X' data is read from memory column circuits 302(1), 302(2) in entry 2 E2 as a result of the read value 337R generated by the counter circuit 334 to be decremented by 1 to generate a value of '2' for the read index RDIX, so that such data can be latched by write latch circuits 332S(1), 332S(2) as data S1, S2 to be written into the same entry 2 E2 in the next scan cycle 1 in FIG. 10B. As discussed above, this has the effect of shifting the previously stored data in the memory bit cells 306(0)(0)-306(3)(2) to "stich" together the memory bit cells 306(0)(0)-306(3)(2) in the multiple column circuits 302(0)-302(2).

As shown in scan cycle 1 in FIG. 10B, data 'B' is written into memory column circuit 302(0) of entry 2 E2 based on the counter circuit 334 in the integrated test circuit 908 in FIG. 9 decrementing the write value 337W that generates a write index WRIX<2> for the entry 2 E2 to be selected for the write operation. Also as part of this write operation, data 'X', 'X' read from entry 2 E2 in memory column circuits 302(1), 302(2) in the scan cycle 0 in FIG. 10A and stored in write latch circuits 332S(1), 332S(2), is written to memory column circuits 302(1), 302(2) in entry 2 E2 as part of the write operation in scan cycle 1 in FIG. 10B.

As shown in scan cycle 2 in FIG. 10C, data 'C' is written into memory column circuit 302(0) of entry 1 E1 based on the counter circuit 334 in the integrated test circuit 908 in FIG. 9 decrementing the write value 337W that generates a write index WRIX<1> for the entry 1 E1 to be selected for the write operation. Also as part of this write operation, data 'X', 'X' read from entry 1 E1 in memory column circuits 302(1), 302(2) in the scan cycle 1 in FIG. 10B and stored in write latch circuits 332S(1), 332S(2), is written to memory column circuits 302(1), 302(2) in entry 1 E1 as part of the write operation in scan cycle 2 in FIG. 10C.

As shown in scan cycle 3 in FIG. 10D, data 'D' is written into memory column circuit 302(0) of entry 0 E0 based on the counter circuit 334 in the integrated test circuit 908 in FIG. 9 decrementing the write value 337W that generates a write index WRIX<0> for the entry 0 E0 to be selected for the write operation. Also as part of this write operation, data 'X', 'X' read from entry 0 E0 in memory column circuits 302(1), 302(2) in the scan cycle 2 in FIG. 10C and stored in write latch circuits 332S(1), 332S(2), is written to memory column circuits 302(1), 302(2) in entry 0 E0 as part of the write operation in scan cycle 3 in FIG. 10D.

As shown in scan cycle 4 in FIG. 10E, data 'E' is written into memory column circuit 302(0) of entry 3 E3 based on the counter circuit 334 in the integrated test circuit 908 in FIG. 9 decrementing the write value 337W that generates a write index WRIX<3> for the entry 3 E3 to be selected for the write operation. Also as part of this write operation, data 'A', 'X' read from entry 3 E3 in memory column circuits 302(1), 302(2) in the scan cycle 3 in FIG. 10D and stored in write latch circuits 332S(1), 332S(2), is written to memory column circuits 302(1), 302(2) in entry 3 E3 as part of the write operation in scan cycle 4 in FIG. 10E. This has the effect of shifting data 'A' previously stored in entry 3 E3 in memory column circuit 302(0), to entry 3 E3 in memory column circuit 302(1) to shift data 'A' in the memory array 900 as a virtualized scan chain.

As shown in scan cycle 5 in FIG. 10F, data 'F' is written into memory column circuit 302(0) of entry 2 E2 based on the counter circuit 334 in the integrated test circuit 908 in FIG. 9 decrementing the write value 337W that generates a write index WRIX<2> for the entry 2 E2 to be selected for the write operation. Also as part of this write operation, data 'B', 'X' read from entry 2 E2 in memory column circuits 302(1), 302(2) in the scan cycle 4 in FIG. 10E and stored in write latch circuits 332S(1), 332S(2), is written to memory column circuits 302(1), 302(2) in entry 2 E2 as part of the write operation in scan cycle 5 in FIG. 10F. This has the effect of shifting data 'B' previously stored in entry 2 E2 in memory column circuit 302(0), to entry 2 E2 in memory column circuit 302(1) to shift data 'B' in the memory array 900 as a virtualized scan chain.

As shown in scan cycle 6 in FIG. 10G, data 'G' is written into memory column circuit 302(0) of entry 1 E1 based on the counter circuit 334 in the integrated test circuit 908 in FIG. 9 decrementing the write value 337W that generates a write index WRIX<1> for the entry 1 E1 to be selected for the write operation. Also as part of this write operation, data 'C', 'X' read from entry 1 E1 in memory column circuits 302(1), 302(2) in the scan cycle 5 in FIG. 10F and stored in write latch circuits 332S(1), 332S(2), is written to memory column circuits 302(1), 302(2) in entry 1 E1 as part of the write operation in scan cycle 6 in FIG. 10G. This has the effect of shifting data 'C' previously stored in entry 1 E1 in memory column circuit 302(0), to entry 1 E1 in memory column circuit 302(1) to shift data 'C' in the memory array 900 as a virtualized scan chain.

As shown in scan cycle 7 in FIG. 10H, data 'H' is written into memory column circuit 302(0) of entry 0 E0 based on the counter circuit 334 in the integrated test circuit 908 in FIG. 9 decrementing the write value 337W that generates a write index WRIX<0> for the entry 0 E0 to be selected for the write operation. Also as part of this write operation, data 'D', 'X' read from entry 0 E0 in memory column circuits 302(1), 302(2) in the scan cycle 6 in FIG. 10G and stored in write latch circuits 332S(1), 332S(2), is written to memory column circuits 302(1), 302(2) in entry 0 E0 as part of the write operation in scan cycle 7 in FIG. 10H. This has the effect of shifting data 'D' previously stored in entry 0 E0 in memory column circuit 302(0), to entry 0 E0 in memory column circuit 302(1) to shift data 'D' in the memory array 900 as a virtualized scan chain.

As shown in scan cycle 12 in FIG. 10I, data 'I', 'J', 'K', and 'L' was written into respective memory column circuit 302(1) of entry 3 E3 and entries 2-0 E2-E0 in memory column circuit 302(0) in scan cycles 8-11 (not shown). The memory array 900 is fully initialized as of scan cycle 11 (not shown) such that known data is stored in each of the memory bit cells 306(0)(0)-306(3)(2). In scan cycle 11 (not shown), the first written data bit 'A' from the serialized test input data SIS stored in memory bit cell 306(3)(2) was output as next read output data 328R(2) on the read data output RD_DATA_OUT<2>, S2. As shown in scan cycle 12 in FIG. 10I, new data bit 'M' is written into memory column circuit 302(0) of entry 3 E3 based on the counter circuit 334 in the integrated test circuit 908 in FIG. 9 decrementing the write value 337W that generates a write index WRIX<3> for the entry 3 E3 to be selected for the write operation. The second written data bit 'B' from the serialized test input data SIS in scan cycle 1 in FIG. 10B, now shifted to the memory bit cell 306(2)(2), is output as next read output data 328R(2) on the read data output RD_DATA_OUT<2>, S2 is scan cycle 12 as shown in FIG. 10I. FIGS. 10J-10L show the state of the memory array 900 in subsequent scan cycles 13-15, with data bits 'C', 'D', and 'E' shifted out of the memory array 900 as read output data 328R(2) on read data output RD_DATA_OUT<2>, S2.

The scan cycles can continue with the counter circuit 334 decrementing the write and read values 337W, 337R (with rollover to value '3' after reaching value '0') to index the entries E3-E0 in memory array 900 in FIG. 9 to write next data received from the serialized test data stream SIS. This is also while reading out data stored in an adjacent entry that was previously written as next read output data 328R(2) on the read data output RD_DATA_OUT<2>, S2 in the same corresponding scan cycle. The next output read data 328R(2) on read data output RD_DATA_OUT<2>, S2 can continue to be compared serially over the scan cycles to the serialized test data stream SI.

The memory array 900 and its integrated test circuit 908 in FIG. 9 can also be configured to operate in a launch/capture mode to have the ability to randomly write test data to the memory array 900 in a scan cycle to then be verified in a next scan cycle. During launch/capture mode, the READ_DATA_OUT<2>, S2 will not match the memory array 900, because the read and write index RDIX, WRIX states are in a random order and not related to each other. After a desired number of launch/capture cycles is performed, the scan enable signal 318 can be set to a scan enable state with the counter 334 being reset to enter back into a scan mode or scan dump mode. At this point, the READ_DATA_OUT<2>, S2 will again match the memory array 900. This is shown by example in FIGS. 11A and 11B, now discussed. Note that in the launch/capture mode, the scan enable signal 318 is set to scan disable mode so that the counter circuit 334 does not generate the write and read values 337W, 337R to generate the write and read indexes WRIX, RDIX.

FIG. 11A shows an exemplary state of the memory array 900 and its entries E3-E0 in a first launch/capture cycle 0. The write index WRIX (see FIG. 3) is set to entry 1 E1 to write data 'X', 'Y', 'Z' on the write data input WR_DATA_IN to entry 1 E1. The read index RDIX is set to 2 to read entry 2 E2 to be read out on the read data output RD_DATA_OUTPUT<0>-RD_DATA_OUT<2> as 'F', 'J', 'N'. For example, entry 2 E2 may have been written in a previous launch/capture cycle before the launch/capture cycle 0 shown in FIG. 11A. FIG. 5A also shows the entries E3-E0 in a serialized format S11-S0 as the memory array 300 appears as a virtualized scan chain.

Then, as shown in FIG. 11B in this example, in a next launch/capture cycle 1 of the launch/capture mode, because entry 1 E1 was written in the previous launch/capture cycle 0 in FIG. 11A, the read index RDIX is set to entry 1 E1 to now read out the data 'X', 'Y', 'Z' from entry 1 E1 as read output data 328R(2) on the read data output RD_DATA_OUT<2>, S2 as 'Z'. The write index WRIX is set to the next entry (entry 3 E3 in this example) according to the setting of the write index WRIX as a random access to write next text data '3' into entry 3. FIG. 11B also shows the entries E3-E0 in a serialized format S11-S0 as the memory array 900 appears as a virtualized scan chain. The read output data 328R(2) on read data output RD_DATA_OUT<2>, S2 can be compared to the corresponding test data at this point. Although not shown, additional launch/capture cycles can be performed to write new data into an entry 3-0 E3-E0 as a random access while reading out the previously written data in a next launch/scan cycle.

Then, as shown in FIG. 12, the integrated test circuit 308 in the memory array 900 in FIG. 9 can be set back to a scan mode if desired by setting the scan enable signal 318 to a scan enable state. As shown in FIG. 12, in this example, the counter circuit 334 sets the read value 337R to '1' so that entry 1 E1 will be read out as the read output data 328R(2) on read data output RD_DATA_OUT<2>, S2 in a scan dump mode. In a scan dump mode, serialized write operations also occur to initialize other entries 3-0 E3-E0 that are not being read in the same cycle as part of the scan chain. As previously discussed and as shown in the example scan cycles in a scan mode in FIGS. 10A-10J, subsequent scan cycles can read out data from entries E3-E0 one at a time in each scan cycle as a scan chain according to the read value 337R generated by the counter circuit 334 and incremented each scan cycle.

Then, if desired and as shown in examples in FIGS. 13A-13D, the integrated test circuit 908 can be configured to return to the scan mode, where test data is both written and read from the memory array 900 in each scan cycle of the scan mode. FIGS. 13A-13D a simultaneous initialization of entries by the integrated test circuit 908 in the memory array 900 with received serialized test data and scan dump from the state of the memory array 900 in FIG. 12 over respective consecutive scan cycles in a scan mode. As shown in scan cycle 16 in the scan mode in FIG. 13A, a next data bit 'A' from the received serialized test data stream SIS on the write data input WR_DATA_IN<0> (FIG. 9) is written into memory column circuit 302(0) in entry 3 E3. Data bits '3', '2' were previously stored in memory column circuits 302(1), 302(2) in entry 3 E3. These data bits '3', '2'' were read out in a previous scan dump in FIG. 12 and latched as read data SI(1), SI(2), and are written into memory column circuits 302(1), 302(2) in entry 3 E3 as part of the write operation in scan cycle 16. As also shown in FIG. 13A, next data bits 'N', 'J', 'F' are read from memory column circuits 902(0)-902(2) of entry 2 E2 onto read data outputs RD_DATA_OUT<0>-RD_DATA_OUT<2> (FIG. 9) as a result of the read value 337R being decremented by the counter circuit 334. Data bits 'N, 'J' from memory column circuits 302(0), 302(1) of entry 2 E2 will be written into the memory row circuit 304(2) for entry 2 E2 in memory column circuits 302(1), 302(2) in the next scan cycle, as shown in FIG. 13B discussed below. FIG. 13A also shows the entries 3-0 E3-E0 in a serialized format S11-S0 as the memory array 900 appears as a virtualized scan chain.

As shown in scan cycle 17 in the scan mode in FIG. 13B, a next data bit 'B' from the received serialized test data stream SIS on the write data input WR_DATA_IN<0> (FIG. 9) is written into memory column circuit 302(0) in entry 2 E2. Data bits 'N', 'J' previously stored in memory column circuits 902(0), 902(1) in entry 2 E2 and read out and latched as read data SI(1), SI(2) in scan cycle 16 in FIG. 13A, are written into memory column circuits 302(1), 302(2) in entry 2 E2 as part of the write operation in scan cycle 17. As also shown in FIG. 13B, next data bits 'Z', 'Y', and 'X' are read from memory column circuits 302(0)-302(2) from entry 1 E1 onto read data outputs RD_DATA_OUT<0>-RD_DATA_OUT,<2> (FIG. 9) as a result of the read value 337R being incremented by the counter circuit 334, to be written into entry 1 E1 in the next memory row circuit 304(1) in the next scan cycle. FIG. 13B also shows the entries E3-E0 in a serialized format S11-S0 as the memory array 900 appears as a virtualized scan chain.

As shown in scan cycle 18 in the scan mode in FIG. 13C, a next data bit 'C' from the received serialized test data stream SIS on the write data input WR_DATA_IN<0> (FIG. 9) is written into memory column circuit 302(0) in entry 1 E1. Data bits 'Z', 'Y' previously stored in memory column circuits 902(0), 902(1) entry 1 E1 and read out and latched as read data SI(1), SI(2) in scan cycle 17 in FIG. 13B, are written into memory column circuits 302(1), 302(2) in entry 1 E1 as part of the write operation in scan cycle 18. As also shown in FIG. 13C, next data bits 'P', 'L', and 'H' are read from memory column circuits 302(0)-302(2) in entry 0 E0 onto read data outputs RD_DATA_OUT<0>-RD_DATA_OUT,<2> (FIG. 9) as a result of the read value 337R being incremented by the counter circuit 334, to be written into entry 0 E0 in next memory row circuit 304(0) in the next scan cycle. FIG. 13C also shows the entries E3-E0 in a serialized format S11-S0 as the memory array 900 appears as a virtualized scan chain.

As shown in scan cycle 19 in the scan mode in FIG. 13D, a next data bit 'D' from the received serialized test data stream SIS on the write data input WR_DATA_IN<0> (FIG. 9) is written into memory column circuit 302(0) in entry 0 E0. Data bits 'P', 'L' previously stored in memory row circuits 302(0), 302(1) in entry 0 E0 and read out and latched as read data SI(1), SI(2) in scan cycle 18 in FIG. 13C, are written into memory column circuits 302(1), 302(2) in entry 0 E0 as part of the write operation in scan cycle 19. As also shown in FIG. 13D, next data bits 'A', '3', and '2' are read from memory column circuits 302(0)-302(2) in entry 3 E3 onto read data outputs RD_DATA_OUT<0>-RD_DATA_OUT,<2> (FIG. 9) to be written into next memory row circuit 304(3) in the next scan cycle. FIG. 13D also shows the entries E3-E0 in a serialized format S11-S0 as the memory array 900 appears as a virtualized scan chain.

It is also possible to provide a memory array that has multiple memory column circuits, like the memory array 900 in FIG. 9, and whose memory row circuits can be controlled to function as a virtualized scan chain in a scan mode, and also include multiple read ports and multiple write ports. In this regard FIG. 14 is a block diagram of another exemplary memory array 1400 that is a random access memory array that can be used to store data in a computing system. The memory array 1400 in FIG. 14 is similar to the memory array 900 in FIG. 9, except that the memory bit cells in the memory array 1400 in FIG. 14 have multiple read ports and multiple write ports. For example, the memory array 1400 may be a static register file (SRF). Common elements between the memory array 900 in FIG. 9 and the memory array 1400 in FIG. 14 are shown with common element numbers and not re-described.

With reference to FIG. 14, the memory array 1400 includes the integrated test circuit 908 like provided in the memory array 900 in FIG. 9. The memory array 1400 in Figure includes the three (3) memory column circuits 302(0)-302(2) that each include four (4) respective memory row circuits 304(0)-304(3) like the memory array 900 in FIG. 9. The respective memory bit cells 306(0)(0)-306(0)(2), 306(1)(0)-306(1)(2), 306(2)(0)-306(2)(2), 306(3)(0)-306(3)(2) in each memory row circuit 304(0)-304(3) constitutes a respective entry ENTRY <0>-ENTRY <3> in the memory array 900, wherein each entry ENTRY <0>-ENTRY <3> is 3 bits long. Each entry ENTRY <0>-ENTRY <3> can be randomly addressed and accessed through a selected memory row circuit 304(0)-304(3) with a respective word line like the memory array 900 in FIG. 9. Unlike the memory array 900 in FIG. 9, each entry ENTRY <0>-ENTRY <3> in the memory array 1400 in FIG. 14 has two (2) separate read ports and two (2) separate write port for access, meaning entry ENTRY <0>-ENTRY <3> can be independently accessed for read and write operations both from respective multiple read and write ports. This is shown by the two sets of read word lines RWL0<0>-RWL0<3>, RWL1<0>-RWL1<3> and two sets of write word lines WWL0<0>-WWL0<3>, WWL1<0>-WWL1<3> coupled to the respective memory row circuits 304(0)-304(3).

The memory array 1400 includes the same write and read decoder circuits 324W, 324R that are configured to drive the first set of read word lines RWL0<0>-RWL0<3> and write word lines WWL0<0>-WWL0<3> like in memory array 900 in FIG. 9. The memory array 1400 in FIG. 14 also includes the read and write selector circuits 316R, 316W that are configured to either pass a received read and write index RD0IX, WR0IX, for a respective read and write operation like the read and write indexes RDIX, WRIX in the memory array 900 in FIG. 9.

The memory array 1400 also includes read and write access to the entries ENTRY <0>-ENTRY <3> for both functional and scan modes through the first read and write ports by driving the read word lines RWL0<0>-RWL0<3> and write word lines WWL0<0>-WWL0<3>, just as described for the read word lines RWL<0>-RWL<3> and write word lines WWL<0>-WWL<3> in the memory array 900 in FIG. 9. The memory array 1400 in FIG. 14 also includes two sets (2) of read data outputs RD_DATA0_OUT<0>-RD_DATA0_OUT<2>, RD_DATA1_OUT<0>-RD_DATA1_OUT<2> and two (2) sets of write data inputs WR_DATA0_IN<0>-WR_DATA0_IN<2>, WR_DATA1_IN<0>-WR_DATA1_IN<2> to provide two separate ports to each memory column circuit 302(0)-302(2) for read data out of and writing data into the memory array 900.

With continuing reference to FIG. 9, the functional mode for the memory array 1400 in FIG. 14 for random accesses can operate through the read and write selector circuits 316R, 316W to drive the first set of read word lines RWL0<0>-RWL0<3> and the first set of write word lines WWL0<0>-WWL0<3> through the read and write decoder circuits 324R, 324W, just as described above in the memory array 900 in FIG. 9. Thus, the functional mode for the memory array 1400 through the read and write ports through the driving of the first set of read word lines RWL0<0>-RWL0<3> and the first set of write word lines WWL0<0>-WWL0<3> will not be re-described here. As discussed below, a functional mode for the memory array 1400 can also operate through the second ports that includes the second read and second write decoder circuits 324R(1), 324W(1) to drive the second set of read word lines RWL1<0>-RWL1<3> and the first set of write word lines WWL1<0>-WWL1<3>.

A write operation in a functional mode to the memory array 1400 through the second write port operates like a write operation in a functional mode through the first port. A write operation in the functional mode for the memory array 1400 in FIG. 14 operates through the second write selector circuit 316W(1) to drive the second set of write word lines WWL1<0>-WWL1<3> through the second write decoder circuit 324W(1). A write operation through the second write port drives writes data to a selected entry ENTRY <0>-ENTRY <3> in the memory array 1400 with write data received second write data inputs WR_DATA1_IN<0>-WR_DATA1_IN<3>. The memory array 1400 includes a second write index input 312W-I(1) that is configured to receive a second write index WR1IX used by a second write decoder circuit 324W(1) to drive the second set of write word lines WWL1<0>-WWL1<3>. The second write index WR1IX received on a second write index input 312W-I(1) is provided to a second write selector circuit 316W(1) that has a second input as a disable input. In this manner, when the memory array 1400 is in a scan mode, the second write selector output 314W-O(1) of the second write selector circuit 316W(1) is not driven (i.e., blocked) so that the second write decoder circuit 324W(1) does not drive the second set of write word lines WWL1<0>-WWL1<3>. Thus, the write index WR1IX is in a don't care state in the scan mode. The read index RD1IX is also in a don't care state, such the read data outputs RD_DATA1_OUT<0>-RD_DATA1_OUT<2> are not used in the scan mode and are not driving another scan data input to be written into the memory array 900.

A read operation in a functional mode to the memory array 1400 through the second write port operates like a read operation in a functional mode through the first port. A read operation in the functional mode for the memory array 1400 in FIG. 14 can also operate through the second decoder circuit 324R(1) to drive the second set of read word lines RWL1<0>-RWL1<3>. A read operation through the second write port drives reads data from a selected ENTRY <0>-ENTRY <3> in the memory array 1400 out onto second read data outputs RD_DATA1_OUT<0>-RD_DATA1_OUT<2>. The memory array 1400 includes a second read index input 312R-I(1) that is configured to receive a second read index RD1IX used by the second read decoder circuit 324R(1) to drive the second set of read word lines RWL1<0>-RWL1<3>. For a read operation through the second port, a second selector circuit is not required—the second read index RD1IX is provided from the read index input 312R-I(1) directly to the second read decoder circuit 324R(1). However, both second read and write ports can be used to access the memory array 1400 in a launch/capture mode.

The scan mode for the memory array 1400 in FIG. 14 also operates like the scan mode operation in the memory array 900 in FIG. 9. For example, the memory array 1400 can be operated in a scan mode like shown in the scan cycle examples for the memory array 900 in FIGS. 10A-10L. The scan mode operates through the read and write selector circuits 316R, 316W to drive the first set of read word lines RWL0<0>-RWL0<3> and write word lines WWL0<0>-WWL0<3> through the read and write decoder circuits 324R, 324W, just as described above in the memory array 900 in FIG. 9. Thus, the scan mode for the memory array 1400 in FIG. 14 will not be re-described here. The memory array 1400 in FIG. 14 can be put into a scan mode and then into a launch capture/mode for testing like previously described for the memory array 900 in FIG. 9 and illustrated in FIGS. 11A and 11B. The memory array 1400 in FIG. 14 can also be controlled to function in a scan dump mode like previously described for the memory array 900 in FIG. 9 and illustrated in FIG. 12. The memory array 1400 in FIG. 14 can also be controlled to return to a scan mode after being in launch capture/mode like previously described for the memory array 900 in FIG. 9 and illustrated in FIGS. 13A-13D.

It is also possible to provide a memory array that includes access entries with only a single, shared port for read and write accesses, and that can be randomly accessed in a functional mode. Such memory array can also include an integrated test circuit configured to cause entries in the memory array to function as a virtualized scan chain in a scan mode, and also allowing the entries in the memory array to be randomly accessed in a non-scan, functional mode, similar to the memory arrays 300, 900, and 1400 in FIGS. 3, 9, and 14.

In this regard, FIGS. 15A and 15B are block diagrams of another memory array 1500 that includes a single, common read and write access port. Thus, a read and write operation cannot be performed at the same time, like in the memory arrays 300, 900, and 1400 in FIGS. 3, 9, and 14. As an example, this allows the memory array 1500 to have memory bit cells that only support single port access, such as a six (6) transistor (T) (6T) SRAM bit cell. Note, as examples, if the memory array 1500 includes SRAM bit cells, the SRAM bit cells can be implemented as static read logic or based on a differential logic that includes complementary nodes and bit lines. Thus, in the memory array 1500 shown in FIG. 15A, two (2) memory banks—a first and second memory banks 1502(0), 1502(1) are provided so that read and write operations can be performed in each memory bank 1502(0), 1502(1) at the same time to perform a scan mode. The first memory bank 1502(0) has the same entries E3-E0 that appear in the memory arrays 900, 1400 in FIGS. 9 and 14, and thus will not be re-described. The second memory bank 1502(1) has similar entries E7-E4 just like the entries E3-E0 in the first memory bank 1502(0), but are provided in a separate memory bank 1502(1). Thus, the first and second memory banks 1502(0), 1502(1) have shared memory column circuits 302(0)-302(2) that have eight (8) entries E7-E0 spread across the two memory banks 1502(0), 1502(1).

Providing separate first and second memory banks 1502(0), 1502(1) in the memory array 1500 allows one memory bank to be written with a serialized test data while data in an adjacent entry in the other memory bank is read, so that a scan mode based on writing scan data to one entry while also reading data from an adjacent entry is possible. The memory array 1500 can be operated in a "ping-pong" type fashion with scan write and read operations being performed in adjacent entries E7-E0 in the respective first and second memory banks 1502(0), 1502(1) such that the combined entries E7-E0 can be controlled to form a scan chain. The first and second memory banks 1502(0), 1502(1) can include the same selector circuits and decoder circuits like in the memory array 300 in FIG. 3, but there are not separate read and write selector and decoder circuits. Only one selector circuit and decoder circuit is provided for each memory bank 1502(0), 1502(1).

Thus, in this example, in a first scan cycle 0 of a scan mode for the memory array 1500 as shown in FIG. 15A, a write enable WR-EN is set to the second memory bank 1502(1) to perform a write operation of data bit 'A' from a serialized test data stream to memory column circuit 302(0) for entry 7 E7, while a read enable RD-EN is set to the first memory bank 1502(0) to perform a read operation to entry 3 E3. Entry 7 E7 in the second memory bank 1502(1) is treated like entry 3 E3 in the first scan cycle for memory array 900 in FIG. 9, shown in FIG. 11A. Entry 3 E3 in the first memory bank 1502(0) is treated like an immediate adjacent entry to entry 7 E7 in the second memory bank 1502(1) and like entry 2 E2 in the first scan cycle for memory array 900 in FIG. 9, shown in FIG. 11A.

Then, in this example, in a second scan cycle 1 of the scan mode for the memory array 1500 as shown in FIG. 15A, the write and read operation are switched to be to the opposite memory bank 1502(0), 1502(1). In this regard, a write enable WR-EN is set to the first memory bank 1502(0) to perform a write operation of data bit 'B' from a serialized test data stream to memory column circuit 302(0) for entry 3 E3 and previously read data 'X', 'X' memory column circuits 302(1), 302(2) of entry 3 E3 in scan cycle 0, to memory column circuits 302(1), 302(2) of entry 3 E3. In the same scan cycle 1, a read enable RD-EN is set to the second memory bank 1502(1) to perform a read operation to entry 6 E6.

Then, in this example, in a next scan cycle 2 of the scan mode for the memory array 1500 as shown in FIG. 15A, the write and read operation are switched to be to the opposite memory bank 1502(0), 1502(1). In this regard, a write enable WR-EN is set back to the second memory bank 1502(1) to perform a write operation of data bit 'C' from a serialized test data stream to memory column circuit 302(0) for entry 6 E6 and previously read data 'X', 'X' from memory column circuits 302(1), 302(2) of entry 6 E6 in scan cycle 1, to memory column circuits 302(1), 302(2) in entry 6 E6. In the same scan cycle 2, a read enable RD-EN is set to the first memory bank 1502(0) to perform a read operation to entry 2 E2.

Then, in this example, in a next scan cycle 3 of the scan mode for the memory array 1500 as shown in FIG. 15A, the write and read operation are switched to be to the opposite memory bank 1502(0), 1502(1). In this regard, a write enable WR-EN is set back to the first memory bank 1502(0) to perform a write operation of data bit 'D' from a serialized test data stream to memory column circuit 302(0) for entry 3 E2 and previously read data 'X', 'X' from memory column circuits 302(1), 302(2) of entry 2 E2 in scan cycle 2, to memory column circuits 302(1), 302(2) in entry 6 E6. In the same scan cycle 3, a read enable RD-EN is set to the second memory bank 1502(0) to perform a read operation to entry 5 E5.

Then, in this example, in a next scan cycle 4 of the scan mode for the memory array 1500 as shown in FIG. 15B, the write and read operation are switched to be to the opposite memory bank 1502(0), 1502(1). In this regard, a write enable WR-EN is set back to the second memory bank 1502(1) to perform a write operation of data bit 'E' from a serialized test data stream to memory column circuit 302(0) for entry 5 E5 and previously read data 'X', 'X' from memory column circuits 302(1), 302(2) of entry 5 E5 in scan cycle 3, to memory column circuits 302(1), 302(2) in entry 6 E6. In the same scan cycle 4, a read enable RD-EN is set to the first memory bank 1502(0) to perform a read operation of data 'X', 'X', 'X' from entry 1 E1.

Then, in this example, in a next scan cycle 5 of the scan mode for the memory array 1500 as shown in FIG. 15B, the write and read operation are switched to be to the opposite memory bank 1502(0), 1502(1). In this regard, a write enable WR-EN is set back to the first memory bank 1502(0) to perform a write operation of data bit 'F' from a serialized test data stream to memory column circuit 302(0) for entry 1 E1 and previously read data 'X', 'X' from memory column circuits 302(1), 302(2) of entry 1 E1 in scan cycle 4, to memory column circuits 302(1), 302(2) in entry 1 E1. In the same scan cycle 5, a read enable RD-EN is set to the second memory bank 1502(1) to perform a read operation of data 'X', 'X', 'X' from entry 4 E4.

Then, in this example, in a next scan cycle 6 of the scan mode for the memory array 1500 as shown in FIG. 15B, the write and read operation are switched to be to the opposite memory bank 1502(0), 1502(1). In this regard, a write enable WR-EN is set back to the second memory bank 1502(1) to perform a write operation of data bit 'G' from a serialized test data stream to memory column circuit 302(0) for entry 4 E4 and previously read data 'X', 'X' from memory column circuits 302(1), 302(2) of entry 4 E4 in scan cycle 5, to memory column circuits 302(1), 302(2) in entry 4 E4. In the same scan cycle 6, a read enable RD-EN is set to the first memory bank 1502(1) to perform a read operation of data 'X', 'X', 'X' from entry E0.

Then, in this example, in a next scan cycle 7 of the scan mode for the memory array 1500 as shown in FIG. 15B, the write and read operation are switched to be to the opposite memory bank 1502(0), 1502(1). In this regard, a write enable WR-EN is set back to the first memory bank 1502(0) to perform a write operation of data bit 'H' from a serialized test data stream to memory column circuit 302(0) for entry E0 and previously read data 'X', 'X' from memory column circuits 302(1), 302(2) of entry E0 in scan cycle 6, to memory column circuits 302(1), 302(2) in entry E0. In the same scan cycle 7, a read enable RD-EN is set to the first memory bank 1502(1) to perform a read operation of data 'G', 'X', 'X' from entry E0.

The scan mode for the memory array 1500 in FIGS. 15A and 15B can continue to operate in a scan mode with the writing of data from a serialized test data stream in subsequent scan cycles beyond, for example, scan cycle 7 in FIG. 15B. The memory array 1500 in FIGS. 15A and 15B can also be put into a scan mode and then into a launch capture/mode for testing like previously described for the memory array 900 in FIG. 9 for example. The memory array 1500 in FIGS. 15A and 15B can also be controlled to function in a scan dump mode like previously described for the memory array 900 in FIG. 9 for example. The memory array 1500 in FIGS. 15A and 15B can also be controlled to return to a scan mode after being in launch capture/mode like previously described for the memory array 900 in FIG. 9 for example.

FIG. 16 is a block diagram illustrating an example of a processor-based system 1600 that can include a computing system 1602 and one or more memory systems for storing data, wherein any of the memory systems can include a memory array 1604 that can be controlled to provide a virtualized scan chain. The memory array 1604 includes access entries that can be randomly accessed, and also includes an integrated test circuit configured to cause entries in the memory array 1604 to function as a virtualized scan chain in a scan mode, and also allowing the entries in the memory array 1604 to be randomly accessed in a non-scan, functional mode. The computing system 1602 includes a system-on-a-chip (SOC) 1606 that includes a CPU(s) 1608. The computing system 1602 may also include a cache memory 1610 that can be accessed by the CPU 1608 for data retrieval. The CPU 1608 is coupled to a system bus 1612 and can intercouple initiator and target devices included in the processor-based system 1600. As is well known, the CPU(s) 1608 communicates with these other devices by exchanging address, control, and data information over the system bus 1612. For example, the CPU 1608 can communicate bus transaction requests to a memory controller 1614 as an example of a subsidiary device as part of a memory system 1616. Although not illustrated in FIG. 16, multiple system buses 1612 could be provided, wherein each system bus 1612 constitutes a different fabric.

Other initiator and target devices can be connected to the system bus 1612. As illustrated in FIG. 16, these devices can include the memory system 1616, one or more input devices 1618, one or more output devices 1620, one or more network interface devices 1622, and one or more display controllers 1624, as examples. The input device(s) 1618 can include any type of input device, including, but not limited to, input keys, switches, voice processors, etc. The output device(s) 1620 can include any type of output device, including, but not limited to, audio, video, other visual indicators, etc. The network interface device(s) 1622 can be any device(s) configured to allow exchange of data to and from a network 1626. The network 1626 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1622 can be configured to support any type of communications protocol desired. The memory system 1616 can include the memory controller 1614 coupled to one or more memory arrays 1628 to store data.

The CPU 1608 may also be configured to access the display controller(s) 1624 over the system bus 1612 to control information sent to one or more displays 1630. The display controller(s) 1624 sends information to display(s) 1630 to be displayed via one or more video processors 1632, which process the information to be displayed into a format suitable for the display(s) 1630. The display(s) 1632 can include any type of display, including, but not limited to, a cathode ray tube (CRT), a liquid crystal display (LCD), a plasma display, a light emitting diode (LED) display, etc.

The CPU 1608, the cache memory 1610, the memory array 1628, the input device 1618, and/or the network 1626 may include a set of computer-readable instructions 1634 stored in a non-transitory computer-readable medium 1636 (e.g., a memory) that can be executed to perform a scan mode, functional mode, launch/capture mode, and/or scan dump mode for controlling a memory array as a scan chain. These computer-readable instructions 1634 can be stored in the memory array 1628 as a non-transitory computer-readable medium 1636. The computer-readable instructions 1634 may also reside, completely or at least partially, within the memory system 1616 during their execution. The computer-readable instructions 1634 may further be transmitted or received over the network 1626 via the network interface device 1622, such that the network 1626 includes the non-transitory computer-readable medium 1636. The computer-readable instructions 1634 may further be transmitted or received from the input device 1618.

While the non-transitory computer-readable media 1636 are shown in an exemplary embodiment to be a single medium, the term "computer-readable medium" should be taken to include a single medium or multiple media (e.g., a centralized or distributed database, and/or associated caches and servers) that store the one or more sets of instructions. The term "computer-readable medium" shall also be taken to include any medium that is capable of storing, encoding, or carrying a set of instructions for execution by the processing device and that cause the processing device to perform any one or more of the methodologies of the embodiments disclosed herein. The term "computer-readable medium" shall accordingly be taken to include, but not be limited to, solid-state memories, optical medium, and magnetic medium.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The initiator devices and target devices described herein may be employed in any circuit, hardware component, integrated circuit (IC), or IC chip, as examples. A processor is a circuit that can include a microcontroller, a microprocessor, or other circuit that can execute software or firmware instructions. A controller is a circuit that can include microcontroller, a microprocessor, and/or dedicated hardware circuits (e.g., a field programmable gate array (FPGA)) that do not necessarily execute software or firmware instruction. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of non-transitory computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

What is claimed is:
1. A memory array, comprising:
    a first memory column circuit comprising:
        a plurality of memory bit cells each contained in a respective memory row circuit of a plurality of memory row circuits; and
    a counter circuit; and
        for each scan cycle of a plurality of scan cycles of a scan mode:
            the memory array is configured to
                receive a next write input data from a serialized test data stream;

the counter circuit is configured to:
  generate a next write value; and
  generate a next read value offset from the next write value by a fixed offset value;
the memory array further configured to:
  index a first memory row circuit of the plurality of memory row circuits at a memory address corresponding to the next write value;
  write the next write input data to a first memory bit cell of the plurality of memory bit cells in the indexed first memory row circuit;
  index a second memory row circuit of the plurality of memory row circuits at a memory address corresponding to the next read value; and
  read a next read output data stored in second memory bit cell of the plurality of memory bit cells in the indexed second memory row circuit, on a read data output.

2. The memory array of claim 1, wherein:
the memory array is further configured to, in response to a write operation in a functional mode:
  receive a second write input data;
  receive a write index; and
  index a third memory row circuit of the plurality of memory row circuits at the write index;
the first memory column circuit is further configured to:
  write the second write input data to a third memory bit cell of the plurality of memory bit cells in the third memory row circuit; and
the memory array is further configured to, in response to a read operation in a functional mode:
  receive a read index;
  index a third memory row circuit of the plurality of memory row circuits at the read index; and
  read a second next read output data stored in to a third memory bit cell of the plurality of memory bit cells in the third memory row circuit, on the read data output.

3. The memory array of claim 1, wherein:
the memory array is further configured to, in response to a launch/capture mode:
  receive a second write input data;
  receive a write index;
  receive a read index;
  index a third memory row circuit of the plurality of memory row circuits at the write index;
  index a fourth memory row circuit of the plurality of memory row circuits at the read index;
  write the second next write input data to a third memory bit cell of the plurality of memory bit cells in the third memory row circuit; and
  read a second next read output data stored in a fourth memory bit cell of the plurality of memory bit cells in the fourth memory row circuit, on the read data output.

4. The memory array of claim 3, wherein in response to a next scan mode following the launch/capture mode:
the memory array is further configured to:
  receive a second next write input data following the next write input data from a second serialized test data stream;
the counter circuit further configured to:
  generate a second next write value offset from the first write value by the fixed offset value; and
  generate a second next read value offset from the second next write value by the fixed offset value;
the memory array further configured to:
  index a third memory row circuit of the plurality of memory row circuits at a memory address corresponding to the second next write value;
  write the second next write input data to a third memory bit cell of the plurality of memory bit cells in the third memory row circuit;
  index a fourth memory row circuit of the plurality of memory row circuits at a memory address corresponding to the second next read value; and
  read a second read output stored in a fourth memory bit cell of the plurality of memory bit cells in the fourth memory row circuit to the read data output.

5. The memory array of claim 1, further comprising:
a write decoder circuit, comprising:
  a write decoder input configured to receive the next write value; and
  a plurality of write decoder outputs each coupled to the plurality of memory bit cells; and
a read decoder circuit, comprising:
  a read decoder input configured to receive the next read value; and
  a plurality of read decoder outputs coupled to the plurality of memory bit cells; and
in the scan mode:
  the write decoder circuit is configured to decode the next write value from the write decoder input to a decoded write index;
  the read decoder circuit is configured to decode the next read value from the read decoder input to a decoded read index; and
  the memory array is configured to:
    index the first memory row circuit at the memory address corresponding to the decoded write index;
    write the next write input data to the first memory bit cell in the indexed first memory row circuit;
    index the second memory row circuit at the memory address corresponding to the decoded read index; and
    read the next read output data stored in the indexed second memory bit cell in the second memory row circuit, on the read data output.

6. The memory array of claim 1, further comprising a write latch circuit configured to receive the next write input data, and a write latch output coupled to the first memory column circuit.

7. The memory array of claim 1, wherein the counter circuit further comprises:
a scan enable input configured to receive a scan enable signal;
a write counter output coupled to the first memory column circuit;
a read counter output coupled to the first memory column circuit; and
for each scan cycle of the plurality of scan cycles of the scan mode:
  the counter circuit configured to, in response to the scan enable signal comprising a scan enable state indicating the scan mode:
    generate the next write value comprising a next write count value on the write counter output; and
    generate the next read value comprising a next read count value offset from the first write count value by the fixed offset value on the read counter output; and the memory array configured to:
    index the first memory row circuit at the memory address corresponding to the next write count value on the write counter output;
    write the next write input data to the first memory bit cell in the indexed first memory row circuit;
    index the second memory row circuit at the memory address corresponding to the next read count value on the read counter output; and
    read the next read output data stored in the indexed second memory bit cell in the second memory row circuit, on the read data output.

8. The memory array of claim 7, wherein the counter circuit is further configured to, in response to the scan enable signal comprising a scan disable state:
    not generate the next write count value on the write counter output; and
    not generate the next read count value offset from the first write count value by the offset value.

9. The memory array of claim 3, further comprising:
    a write selector circuit, comprising:
        a first write selector input coupled to a write index input configured to receive the write index;
        a second write selector input coupled to the write counter output configured to receive the next write value; and
        a write selector output coupled to the first memory column circuit; and
    a read selector circuit, comprising:
        a first read selector input coupled to a read index input configured to receive the read index;
        a second read selector input configured to receive the next read value; and
        a read selector output coupled to the first memory column circuit;
    in the scan mode:
        the write selector circuit configured to pass the next write value from the second write selector input to the write selector output; and
        the read selector circuit configured to pass the next read value from the second read selector input to the read selector output; and
    in the launch/capture mode:
        the write selector circuit configured to pass the write index from the first write selector input to the write selector output; and
        the read selector circuit configured to pass the read index from the first read selector input to the read selector output.

10. The memory array of claim 8, further comprising:
    a write decoder circuit, comprising:
        a write decoder input coupled to the write selector output; and
        a plurality of write decoder outputs each coupled to the write selector output; and
    a read decoder circuit, comprising:
        a read decoder input configured to receive the next read value; and
        a plurality of read decoder outputs coupled to the read selector output; and
    in the scan mode:
        the write decoder circuit is configured to decode the next write value from the write decoder input to a decoded write index;
        the read decoder circuit is configured to decode the next read value from the read decoder input to a decoded read index;
        the memory array is configured to:
            index the first memory row circuit at the memory address corresponding to the decoded write index;
            write the next write input data to the first memory bit cell in the indexed first memory row circuit;
            index the second memory row circuit at the memory address corresponding to the decoded write index; and
            read the next read output data stored in the second memory bit cell in the indexed second memory row circuit, on the read data output; and
    in the launch/capture mode:
        the write decoder circuit is configured to decode the write index from the write decoder input to a second decoded write index;
        the read decoder circuit is configured to decode the read index from the read decoder input to a second decoded read index; and
        the memory array is configured to:
            index the first memory row circuit at the second decoded write index;
            index the second memory row circuit at the second decoded write index;
            write the next write input data to the first memory bit cell in the indexed first memory row circuit; and
            read the next read output data stored in the second memory bit cell in the indexed second memory row circuit, on the read data output.

11. The memory array of claim 1, wherein:
    the first memory column circuit further comprises:
        a first write bit line coupled to the plurality of first memory bit cells;
        a first read bit line coupled to the plurality of first memory bit cells and a first read output;
        a plurality of write word lines each coupled to a memory row circuit of the plurality of memory row circuits; and
        a plurality of read word lines each coupled to a memory row circuit of the plurality of memory row circuits;
    the memory array configured to, for each scan cycle of the plurality of scan cycles of the scan mode:
        index the first memory row circuit at the memory address corresponding to the next write value, by being configured to enable a next write word line of the plurality of write word lines coupled to the first memory row circuit corresponding to the next write value;
        write the next write input data on the first write bit line to the first memory bit cell coupled to the enabled next write word line in the first memory row circuit;
        index the second memory row circuit at the memory address corresponding to the next read value, by being configured to enable a next read word line of the plurality of read word lines coupled to the second memory row circuit corresponding to the next read value; and
        read a next read output data stored in the second memory bit cell in the second memory row circuit coupled to the enabled next read word line, on the read data output.

12. The memory array of claim 1, wherein the plurality of first memory bit cells comprises a plurality of static memory bit cells.

13. The memory array of claim 1, wherein the plurality of first memory bit cells comprises a plurality of eight (8) transistor (T) (8T) static random access memory (SRAM) bit cells.

14. The memory array of claim 1, further comprising:
a second memory column circuit, comprising:
   a plurality of second memory bit cells; and
in response to a second scan cycle of a scan mode following a first scan cycle of the scan mode:
   the memory array further configured to:
      receive a second next write input data following the next write input data from the serialized test data stream;
the counter circuit further configured to:
   generate a second next write value offset from the first write value by the fixed offset value; and
   generate a second next read value offset from the second next write value by the fixed offset value;
the memory array further configured to:
   index a third memory row circuit of the plurality of memory row circuits at a memory address corresponding to the second next write value;
   write the second next write input data to a third memory bit cell of the plurality of memory bit cells in the indexed third memory row circuit;
   write the next read output data to a third memory bit cell of the plurality of second memory bit cells in the indexed third memory row circuit;
   index a fourth memory row circuit of the plurality of memory row circuits at a memory address corresponding to the second next read value; and
   read a second next read output data stored in a fourth memory bit cell of the plurality of memory bit cells in the indexed fourth memory row circuit, on the read data output.

15. The memory array of claim 14, further comprising:
a first write selector circuit, comprising:
   a first write selector input coupled to a first write index input configured to receive the write index;
   a second write selector input coupled to the write counter output configured to receive the next write value; and
   a write selector output coupled to the second memory column circuit;
a first read selector circuit, comprising:
   a first write selector input coupled to a read index input configured to receive the read index;
   a second write selector input configured to receive the next read value; and
   a read selector output coupled to the second memory column circuit;
in the scan mode:
   the first write selector circuit configured to pass the next write value from the second write selector input to the write selector output; and
   the first read selector circuit configured to pass the next read value from the second read selector input to the read selector output; and
in the launch/capture mode:
   the first write selector circuit configured to pass the write index from the first write selector input to the write selector output; and
   the first read selector circuit configured to pass the read index from the first read selector input to the read selector output.

16. The memory array of claim 15, further comprising:
a second write selector circuit, comprising:
   a third write selector input coupled to a second write index input configured to receive a second write index; and
   a second write selector output coupled to the first memory column circuit and the second memory column circuit; and
in the launch/capture mode:
   the second write selector circuit configured to pass the second write index from the third write selector input to the second write selector output.

17. The memory array of claim 1, wherein:
the plurality of memory row circuits comprises a plurality of first memory row circuits and a plurality of second memory row circuits; and
the first memory column circuit comprises:
   a first memory bank comprising the plurality of first memory row circuits; and
   a second memory bank comprising the plurality of second memory row circuits.

18. The memory array of claim 17, wherein the memory array is further configured to, for each scan cycle of the plurality of scan cycles of the scan mode:
   index a first memory row circuit of the plurality of second memory row circuits in the second memory bank at the memory address corresponding to the next write value;
   write the next write input data to a first memory bit cell of the plurality of second memory bit cells in the indexed first memory row circuit in the second memory bank;
   index a second memory row circuit of the plurality of first memory row circuits in the first memory bank at the memory address corresponding to the next read value; and
   read a next read output data stored in a second memory bit cell of the plurality of first memory bit cells in the indexed second memory row circuit in the first memory bank, on a read data output.

19. The memory array of claim 18, wherein the memory array is further configured to, in response to a second scan cycle of the scan mode following a first scan cycle of the plurality of scan cycles of the scan mode:
   receive a second next write input data from the serialized test data stream;
   index a second memory row circuit of the plurality of first memory row circuits in the first memory bank at the memory address corresponding to the next read value;
   write the second next write input data to a second memory bit cell of the plurality of first memory bit cells in the indexed second memory row circuit in the first memory bank;
   index a second memory row circuit of the plurality of second memory row circuits in the second memory bank at the memory address corresponding to the next read value; and
   read a next read output data stored in a second memory bit cell of the plurality of second memory bit cells in the indexed second memory row circuit in the second memory bank, on the data read output.

20. The memory array of claim 1, wherein the plurality of first memory bit cells comprises a plurality of six (6) transistor (T) (6T) static random access memory (SRAM) bit cells, and the plurality of second memory bit cells comprises a plurality of 6T SRAM bit cells.

21. A method of scanning a memory array comprising a counter circuit, comprising:

for each scan cycle of a plurality of scan cycles of a scan mode:

receiving a next write input data from a serialized test data stream;

generating a next write value;

generating a next read value offset from the next write value by a fixed offset value in the counter circuit;

indexing at a memory address corresponding to the next write value, a first memory row circuit of a plurality of memory row circuits in a first memory column circuit, the first memory column circuit comprising a plurality of memory bit cells each contained in a respective memory row circuit of the plurality of memory row circuits;

writing the next write input data to a first memory bit cell of the plurality of memory bit cells in the indexed first memory row circuit;

indexing a second memory row circuit of the plurality of memory row circuits at a memory address corresponding to the next read value in the counter circuit; and reading a next read output data stored in the second memory bit cell of the plurality of memory bit cells in the indexed second memory row circuit, on a read data output.

22. A non-transitory computer-readable medium having stored thereon computer executable instructions which, when executed by a processor in a computing system, cause the processor to:

for each scan cycle of a plurality of scan cycles of a scan mode:

receive a next write input data from a serialized test data stream;

generate a next write value in a counter circuit;

generate a next read value offset from the next write value by a fixed offset value in the counter circuit;

index at a memory address corresponding to the next write value, a first memory row circuit of a plurality of memory row circuits in a first memory column circuit, the first memory column circuit comprising a plurality of memory bit cells each contained in a respective memory row circuit of the plurality of memory row circuits;

write the next write input data to a first memory bit cell of the plurality of memory bit cells in the indexed first memory row circuit;

index a second memory row circuit of the plurality of memory row circuits at a memory address corresponding to the next read value; and read a next read output data stored in a second memory bit cell of the plurality of memory bit cells in the indexed second memory row circuit, on a read data output.

* * * * *